(12) United States Patent
Gießibl et al.

(10) Patent No.: US 12,372,556 B2
(45) Date of Patent: Jul. 29, 2025

(54) CURRENT SENSOR

(71) Applicant: Methode Electronics Malta Ltd., Birkirkara (MT)

(72) Inventors: Johannes Gießibl, Amerang (DE); Julius Beck, Munich (DE); Florian Burghardt, Neuching (DE); Ibai Sarria, Munich (DE); Allen Carl Bonnici, Mosta (MT)

(73) Assignee: Methode Electronics Malta Ltd., Birkirkara (MT)

( * ) Notice: Subject to any disclaimer, the term of this patent is extended or adjusted under 35 U.S.C. 154(b) by 166 days.

(21) Appl. No.: 17/725,877

(22) Filed: Apr. 21, 2022

(65) Prior Publication Data
US 2023/0040496 A1 Feb. 9, 2023

(30) Foreign Application Priority Data
Apr. 22, 2021 (DE) ................ 10 2021 110 370.3

(51) Int. Cl.
*G01R 15/14* (2006.01)
(52) U.S. Cl.
CPC ................. *G01R 15/148* (2013.01)
(58) Field of Classification Search
CPC ...... G01R 15/14; G01R 15/148; G01R 15/20; G01R 15/205; G01R 15/18; G01R 15/181; G01R 15/202; G01R 15/207; H05K 9/0088
See application file for complete search history.

(56) References Cited

U.S. PATENT DOCUMENTS

| | | | |
|---|---|---|---|
| 9,683,906 B2 | 6/2017 | Gießibl | |
| 9,958,295 B2 | 5/2018 | Gießibl | |
| 10,151,652 B2 | 12/2018 | Gießibl | |
| 10,247,578 B2 | 4/2019 | Bonnici et al. | |
| 10,488,278 B2 | 11/2019 | Gießibl | |
| 2013/0141077 A1* | 6/2013 | Wellenstein | G01R 23/02 324/76.39 |
| 2014/0218018 A1* | 8/2014 | Ivanov | G01R 33/02 324/252 |
| 2017/0184635 A1* | 6/2017 | Ugge | G01R 15/207 |
| 2021/0048454 A1 | 2/2021 | Choi | |
| 2021/0223292 A1* | 7/2021 | Liu | G01R 15/202 |

OTHER PUBLICATIONS

Co-pending U.S. Appl. No. 17/836,243, filed Jun. 9, 2022.

* cited by examiner

*Primary Examiner* — Son T Le
(74) *Attorney, Agent, or Firm* — Greenberg Traurig, LLP

(57) ABSTRACT

A current sensor has at least one support element that is configured to carry at least one sensing coil of at least two sensing coils of the current sensor. The support element has at least one face on which at least one sensing coil is arranged. The sensing coil is to be used in connection with a current transferring conductor. The at least two sensing coils differ from each other in respect of at least one of an angular orientation of the individual sensing coil relative to a longitudinal axis of the current transferring conductor and/or a vertical distance of the individual sensing coil relative to the current transferring conductor.

14 Claims, 33 Drawing Sheets

CURRENT SENSOR

RELATED APPLICATION DATA

This application claims priority benefit of German patent application ser. no. DE 10 2021 110 370.3, filed Apr. 22, 2021, currently pending, the disclosure of which is incorporated by reference herein.

DESCRIPTION

The present disclosure relates to a current sensor.

BACKGROUND ART

The US 2021/0048454 A1 discloses an integrated current-measuring apparatus including a printed circuit board. The printed circuit board is designed as a shunt resistor. It includes a resistive element which has a present resistance and terminals extending from both sides of the resistive element. The resistor is attached to a bottom surface of the printed circuit board. A hall sensor is mounted on a top surface of the printed circuit board to face the shunt resistor with the printed circuit board being imposed between the hall sensor and the shunt resistor.

OBJECTIVE OF THE DISCLOSURE

The objective of the disclosure is to provide a current sensor which is inexpensive, needs less building space compared to the ones currently available and which is easy to install.
Solution This objective is achieved by a current sensor comprising at least one support element to be used in connection with a current transferring conductor.

The support element carries at least one sensing coil. The support element has at least one face on which at least one sensing coil is arranged.

At least two sensing coils differ from each other in respect of an angular orientation of the individual sensing coil relative to a longitudinal axis of the current transferring conductor.

Alternatively, they differ from each other in respect of a vertical distance of the individual sensing coil relative to the current transferring conductor.

Current flows through the current transferring conductor producing a magnetic field.

The support element is positioned in the vicinity of the current transferring conductor.

Also, the support element is arranged in an angle relative to the magnetic field created by the current transferring conductor.

A sensitivity of the sensing coil regarding the magnetic field depends on the angular orientation of the sensing coil relative to the magnetic field generated by the current flowing through the current transferring conductor.
Current Sensor Commonly known current sensors measure a current flowing through a current transferring conductor. The current flowing through the current transferring conductor produces a magnetic field in the area around the current transferring conductor. The current transferring conductor may be designed as a busbar.

Instead of a so called busbar, any other current transferring conductor can be employed.

Within the current sensor sensing coils are arranged. There are various options where and how the sensing coils can be placed relative to the busbar.

Coils are used for generating and/or detecting a magnetic field. The sensing coil has a sensitivity which is defined by either the location or the angular orientation or by a distance of the sensing coil relative to the current transferring conductor.

The sensing coil is referred to in more detail below.

The current sensor measures a magnetic field generated by the current flowing through the current transferring conductor.

Commonly known current sensors include techniques such as a shunt resistor, a current transformer and/or a magnetic-field based transducer.

The current sensor generates a signal proportional to the sensed magnetic field.

The signal generated by the current sensor can be used to display the measured current for example in an ammeter.

The techniques used for measuring the electric current can be classified depending upon the underlying physical principles.

The current sensor may comprise at least one first channel and one second channel.

The first channel and the second channel may comprise at least two coils each. Both coils may be aligned axially or radially relative to one another.

The at least two coils each are arranged adjacent to the current transferring conductor.

Relative to the individual sensitivity of the individual coil, both channels (first and second channel) may have different sensitivities.

The measurement of the electric current can rely on a Faraday effect or on a Hall effect sensor.

For measuring the electric current, a flux gate sensor or a shunt resistor can be employed.

Also, a fiber optic current sensor can be used to measure the electric current. It goes without saying that an electric current can be detected and/or measured by other technical means as well.

In the following, by way of example, the disclosure relies on a magnetic field sensor to measure a magnetic field generated by a current flowing through a current transferring conductor.

The magnetic field sensor, measuring a magnetic field generated by a current flowing through a current transferring conductor, can be a Hall effect sensor. The current sensor can also be a flux gate sensor or a magneto-resistive current sensor.

The Hall effect sensor senses a magnetic field which is produced by the magnetic system.

The Hall effect sensor is a basic magnetic field sensor which requires signal conditioning to make the output usable for most applications.

A flux gate sensor commonly works on similar measurement principle as the Hall effect sensor referred to above.

With both sensors (Hall effect sensor and flux gate sensor) the magnetic field is created by a current, wherein the measuring is performed by a specific sensing element.

Contrary to the Hall effect sensor, the flux gate sensor uses a saturable inductor instead of a Hall effect sensor.

The magneto-resistive current sensor is usually designed as a two terminal device changing its resistance parabolically with the applied magnetic field.

The variation of the resistance of the magneto-resistor is due to the magnetic field. This is also known as the magneto-resistive effect.

Support Element

The support element carries at least one sensing coil.

The support element provides at least one face on which at least one sensing coil is arranged.

It goes without saying that the support element may comprise two or more faces.

Thus, the support element may have a rectangular shape with the two faces of the support element are facing away from each other.

The support element in form of a rectangular body may also have more than two faces to carry sensing coils.

Each of the faces of the support element carries at least one sensing coil.

The support element is positioned in the vicinity of the current transferring conductor.

In its position adjacent to the current transferring conductor the support element is arranged in an angle relative to the magnetic field of the current transferring conductor, produced by the current flowing through the current transferring conductor.

The magnetic field of the current transferring conductor is referred to in more detail below.

In one embodiment of the disclosure the support element carrying at least four sensing coils is clipped onto the current transferring conductor.

The support element may be clipped onto the current transferring conductor, providing a friction lock.

The support element may also be clipped onto the current transferring conductor by means of a form-fitted link or by a fabric-blocked link.

The support element may comprise a flat sheet of insulating material.

The support element may further comprise a layer of copper foil being laminated to the support element.

The support element may be any form of a substrate.

By way of example the support element is a printed circuit board which mechanically supports and electrically connects electrical or electronic components.

The support element has at least one conductive track or at least one conductive pad and/or other features etched from one or more sheet layers of copper laminated onto and/or between sheet layers of a non-conductive substrate.

As referred to above, the support element may be single-sided or double-sided.

The single-sided support element comprises one copper layer, whereas the double-sided support element carries copper layers on both faces of one support element.

The support element may provide a multitude of faces, wherein each face of the support element may carry at least one sensing coil.

Sensing Coil

The sensing coil can also be an electro-magnetic coil. The sensing coil is an electrical conductor such as a wire.

The sensing coil interacts with the magnetic field created by a current flowing through the current transferring conductor.

According to the disclosure, the electric current flows through the current transferring conductor, thus generating a magnetic field.

The sensing coil comprises a winding having at least one loop. Accordingly, the sensing coil may be composed of a number of loops arranged axially one behind the other.

In the centre of the loops of the sensing coil there is a core area.

The loops of the sensing coil are insulated electrically from each other.

According to one embodiment of the disclosure, the sensing coil is connected with the support element and/or with another sensing coil and/or with the current transferring conductor in a common mode rejection.

The common mode rejection indicates how little the output voltage changes when two input voltages of an electrical differential amplifier change by the same amount.

Thus, the two input voltages of the electrical differential amplifier change in a common mode.

Another embodiment of the disclosure provides at least two sensing coils arranged in an angle relative to a longitudinal axis of the current transferring conductor, respectively.

The angles of the sensing coils relative to the longitudinal axis differ from one another.

To maintain a certain position relative to the longitudinal axis of the current transferring conductor the at least two, preferably four, sensing coils are mounted onto a support element.

Thus, the sensing coils may be positioned in an angle between zero and ninety degrees relative to the longitudinal axis of the current transferring conductor.

The sensing coil can also be placed at any other angle relative to the longitudinal axis of the current transferring conductor.

In another embodiment of the disclosure the sensing coil extends along the longitudinal axis of the current transferring conductor.

According yet to another embodiment of the disclosure at least two sensing coils are arranged transverse to the longitudinal axis.

Following the angular orientation of the sensing coil relative to the longitudinal axis of the current transferring conductor the angular orientation of the sensing coil relative to the magnetic field is changed.

In other words, the angular orientation of the sensing coil relative to the longitudinal axis of the current transferring conductor influences the angular orientation of the sensing coil relative to the magnetic field generated by a current flowing through the current transferring conductor.

The angular orientation of the sensing coil relative to the magnetic field, generated by the current flowing through the current transferring conductor determines the sensitivity of the sensing coil.

Simply by way of example, the following values of the angular orientation of the sensing coil relative to the current transferring conductor and/or to the magnetic field lead to corresponding values of sensitivity of the respective sensing coil.

It goes without saying, that different angular values may also be used.

TABLE 1

| Angular orientation in ° (degree) | Sensitivity in % (percent) |
| --- | --- |
| 0° | 100% |
| 25.8° | 90% |
| 36.8° | 80% |
| 45° | 70% |
| 53.1° | 60% |
| 60° | 50% |
| 66.4° | 40% |
| 75° | 25% |
| 84.25° | 10% |
| 90° | 0% |

Referring to the table 1 above, an angular orientation of 60° (degrees) of a specific coil relative to the longitudinal axis of the current transferring conductor and/or relative to the magnetic field of the current transferring conductor leads to a sensitivity of the respective coil in the amount of 50%.

A maximum sensitivity (100%) of the coil is achieved with an angular orientation of 0° (degrees) of the specific coil relative to the magnetic field of the current transferring conductor.

A minimum sensitivity (0%) of the coil is achieved with an angular orientation of 90° (degrees) of the specific coil relative to the magnetic field of the current transferring conductor.

According to another embodiment of the disclosure the sensing coil is arranged on the face of the support element directed towards the current transferring conductor.

Another embodiment of the disclosure provides the sensing coil on the face of the support element facing away from the current transferring conductor.

At least one sensing coil may be arranged on both faces of the support element.

According to a further embodiment of the disclosure, at least two support elements may be arranged at one side of the current transferring conductor.

The at least two support elements can be arranged axially relative to the current transferring conductor.

Also, the at least two support elements can be arranged radially relative to the current transferring conductor.

The at least two support elements, arranged radially and/or axially relative to the current transferring conductor may provide at least one sensing coil. At least two sensing coils may be positioned on each of the faces of the support elements.

A further embodiment of the disclosure shows at least two sensing coils being arranged on each face of the support element. Wherein, the faces of the support elements are facing away from each other.

This embodiment provides at least two sensing coils showing in opposite directions relative to each other.

Also the sensing coils are arranged at different distances relative to the current transferring conductor.

According to another embodiment of the disclosure, the sensing coils are arranged symmetrically to each other on the faces of the support element.

It goes without saying that the sensing coils may also be arranged asymmetrically to each other on the faces of the support element.

The axis of symmetry may be perpendicular to the support element.

By way of example, the axis of symmetry may also extend in the plane passing through the support element.

Another embodiment of the disclosure reveals that the sensing coil sensing the magnetic field has a sensitivity.

The sensitivity depends on a location of the sensing coil relative to the current transferring conductor.

It may also depend on an angular orientation of the sensing coil relative to the current transferring conductor.

Alternatively, the sensitivity may also depend on a distance of the sensing coil relative to the current transferring conductor.

The sensitivity of the sensing coil comprises all values, including the maximum and the minimum values of applied current parameters that can be measured.

The sensitivity of the sensing coil inter alia depends on the angular orientation of the sensing coil relative to the longitudinal axis of the current transferring conductor.

Another embodiment of the disclosure provides a housing which includes one or more of the sensing coils and of the support elements.

The housing surrounds the sensing coils and/or the support element and/or the current transferring conductor at least partially.

The housing helps to protect the enclosed components from contamination and/or from damage.

Current Transferring Conductor

The current transferring conductor conducts current.

The ability of the current transferring conductor to allow current to flow through is called electrical conductivity.

Usually the current transferring conductor is manufactured from at least one metal. Among other metals, the current transferring conductor may be made from copper.

The current transferring conductor may also comprise an alloy of a variety of metals.

Another embodiment of the disclosure reveals a current transferring conductor in form of a busbar.

The busbar can be made of a rectangular flat metal body. The busbar may be a flat stripe. It may also be provided as a solid bar or a rod. Busbars can be formed in a number of different shapes.

The busbar is made for distributing high current power.

Busbars are usually uninsulated. They have a sufficient stiffness.

Usually, busbars are composed of copper, brass or aluminium.

Current Transferring Conductor and the Magnetic Field

A current flowing through the current transferring conductor produces a magnetic field. The magnetic field runs perpendicular to the current flowing through the current transferring conductor.

Simply by way of example, the current is flowing along the longitudinal axis of the current transferring conductor generating a magnetic field. The magnetic field extends radially relative to the longitudinal axis of the current transferring conductor.

Furthermore, the magnitude of the magnetic field is proportional to the amount of current flowing through the current transferring conductor.

The radiant of the magnetic field is influenced by the geometry of the current transferring conductor.

The corners of a current transferring conductor of a rectangular shape (such as: busbar) influence the magnetic field of the current transferring conductor. Thus, at distances close to the current transferring conductor (busbar) the magnetic fields would resemble an ellipse.

According to a further embodiment of the disclosure the current transferring conductor has a bore.

The support element carrying at least two sensing coils extends through the bore of the current transferring conductor.

Extending through the bore of the current transferring conductor the support element has an angular orientation, preferably rectangular, to the current transferring conductor.

Also, the support element extending through the bore of the current transferring conductor has a perpendicular orientation relative to the magnetic field.

The bore being placed in the centre of the current transferring conductor splits the current into two equal parts.

The magnetic fields generated by the current flowing through the current transferring conductor creates opposite gradients inside the bore.

The magnetic field runs perpendicular to the current flowing through the current transferring conductor. Thus, the magnetic field concentrates towards the centre of the bore of the current transferring conductor. The bore of the current transferring conductor causes the magnetic field to have a 3-dimensional aspect.

Extending through the bore of the current transferring conductor the support element can be placed in parallel with the current flowing through the current transferring conductor.

In the bore, the support element can also be in position rectangular to the direction of the flow of the current within the current transferring conductor.

DESCRIPTION OF DRAWINGS

The disclosure is explained in more detail below by way of four examples, wherein:

In FIGS. 7 to 11 the values (I) on the X-axis of the coordinate system refer to the intensity of the current flowing through the busbar. The values of the intensity of the current are given in A (Ampere).

In FIGS. 7 to 11 the values Vout (in mV) on the Y axis refer to the tension induced in the sensing coil by the current flowing through the busbar.

DETAILED DESCRIPTION

Figure 1:
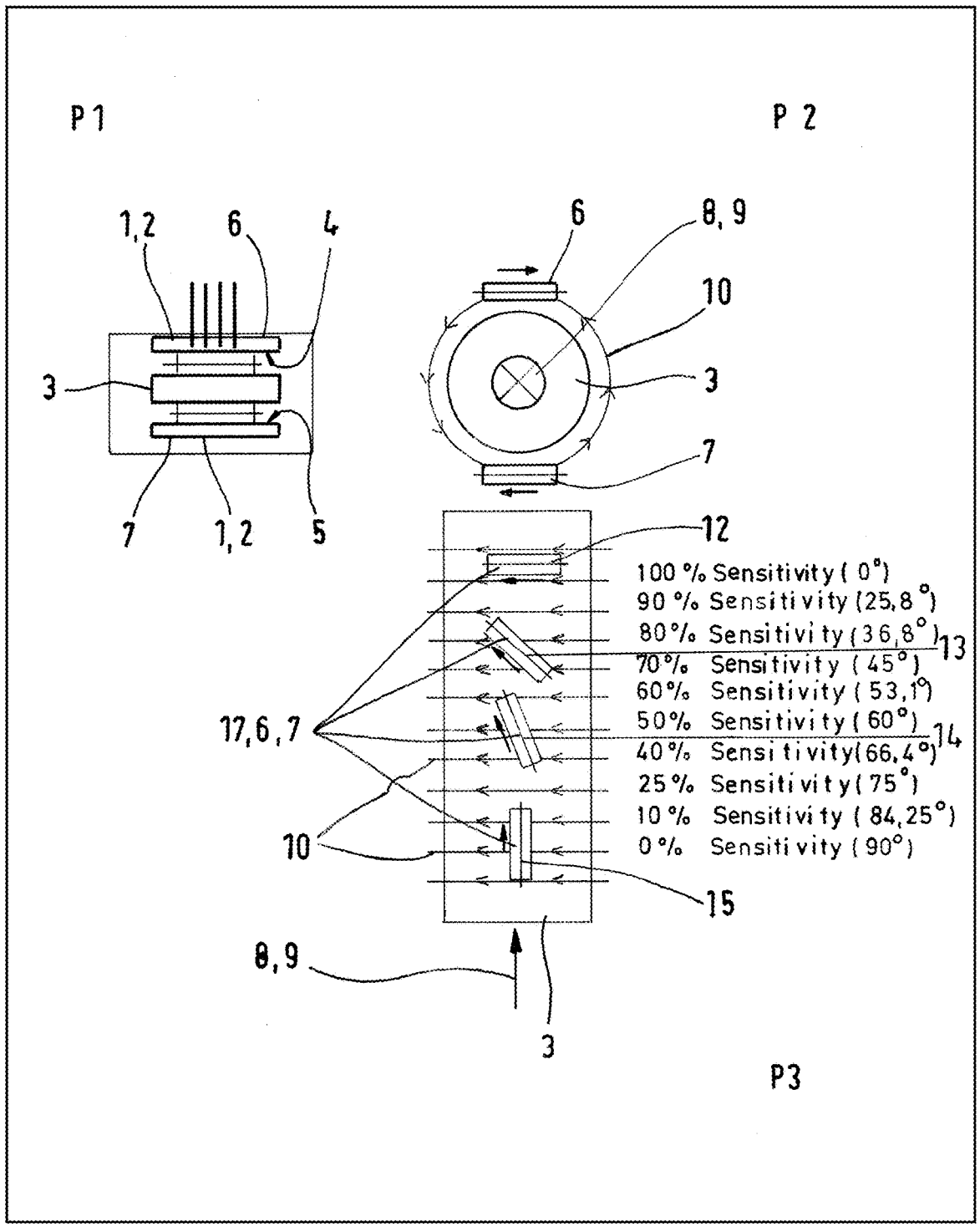
FIG. 1 shows a current transferring conductor with four sensing coils which are arranged planar relative to the current transferring conductor.

FIG. 1 shows a partial view p 1 with two support elements 1, 2 being clipped onto a current transferring conductor 3.

Each support element 1, 2 provides a face 4, 5, looking towards the current transferring conductor 3, respectively.

On the face 4, 5, looking towards the current transferring conductor 3, each support element 1, 2 carries a sensing coil 6, 7.

The partial view p 2 of FIG. 1 is a section of the current transferring conductor 3 in side view.

A current 8 is flowing in direction of a longitudinal axis 9 of the current transferring conductor 3, producing a magnetic field 10.

With the support element 1, 2 not shown, the sensing coils 6, 7 are arranged in the vicinity of the current transferring conductor 3.

Thus, each sensing coil 6, 7 is exposed to the magnetic field 10.

The partial view p 3 of FIG. 1 reveals that an angular orientation 12 of the sensing coil 6, 7 provides a sensitivity of the sensing coil 6, 7 relative to the magnetic field 10 of 100%.

An angular orientation 13 of the sensing coil 6, 7 relative to the longitudinal axis 9 of the current transferring conductor 3 and/or relative to the magnetic field 10 provides a sensitivity of the sensing coil 6, 7 relative to the magnetic field 10 of approximately 70%.

An angular orientation 14 of the sensing coil 6, 7 relative to the magnetic field 10 of the current transferring conductor 3, relative to the longitudinal axis 9 of the current transferring conductor 3 leads to a sensitivity of the sensing coil 6, 7 of 40%.

An angular orientation, approximately perpendicular to the magnetic field 10 provides a sensitivity of the sensing coil 6, 7 of 0%.

Figure 2:
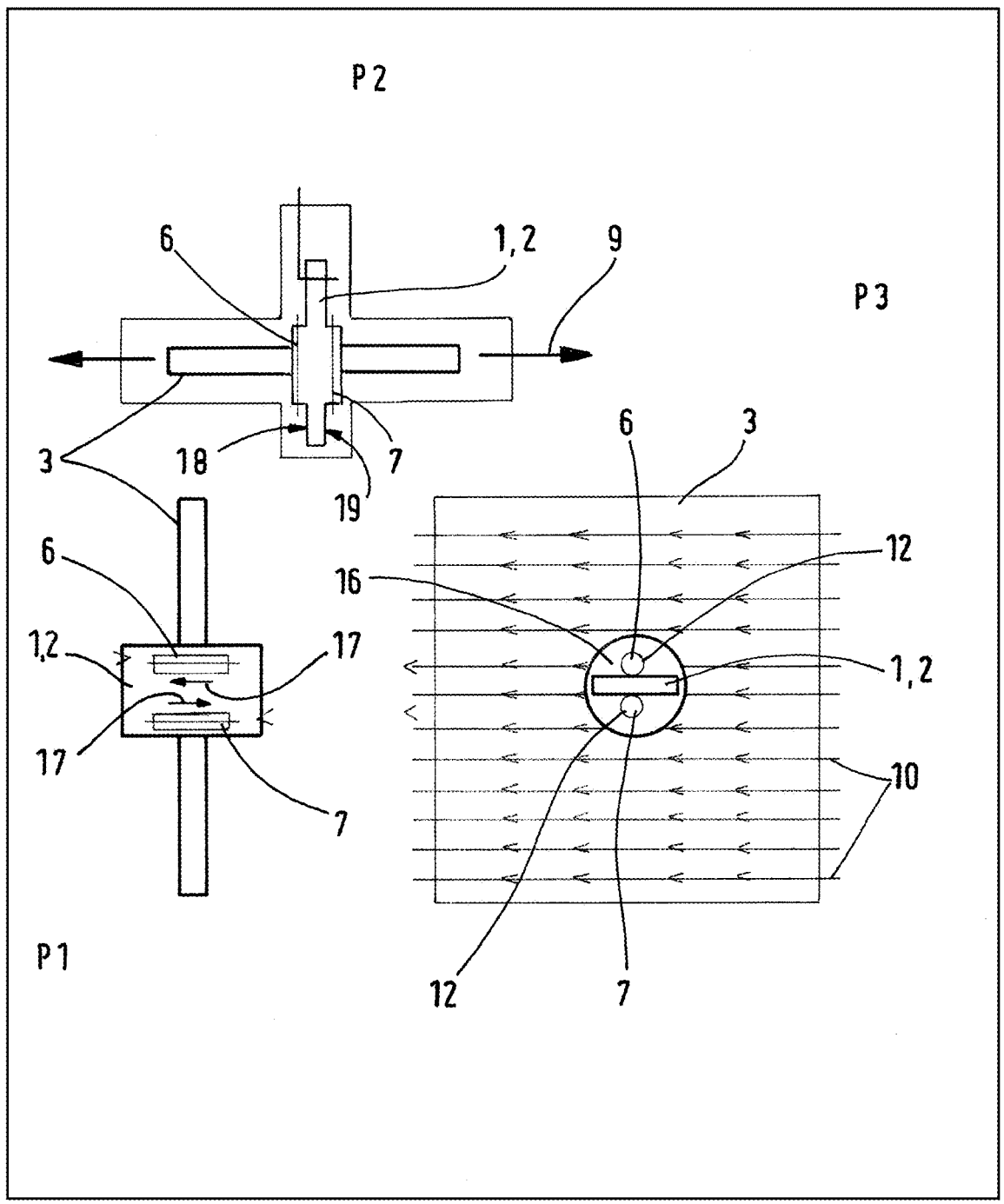
FIG. 2 shows a current transferring conductor having a bore with a support element extending through the bore.

A partial view p 1 of FIG. 2 shows a current transferring conductor 3 having a bore 16.

The support element 1, 2 extends through the bore 16 of the current transferring conductor 3.

The support element 1, 2 provides two sensing coils 6, 7. The sensing coils 6, 7 have different polarities 17.

A partial view p 2 of FIG. 2 shows a section through the current transferring conductor 3.

The support element 1, 2 extends through the bore 16.

The support element 1, 2 has two faces.

The faces 4, 5 of the support element 1, 2 are looking into opposite directions, relative to each other.

The partial view p 3 of FIG. 2 shows a plane view of the current transferring conductor 3, in the centre of which is a bore 16.

A current 8 extending along the longitudinal axis 9 generates a magnetic field 10, extending radially, relative to the longitudinal axis 9 of the current transferring conductor 3.

The support element 1, 2 extends through the bore 16 of the current transferring conductor 3.

The sensing coils 6, 7 arranged on the faces 4 and 5 of the support element 1 have an angular orientation 12 relative to the magnetic field 10 extending through the bore 16.

The angular orientation 12 of the sensing coil 6, 7 leads to a sensitivity of the sensing coil 6, 7 of 100%.

Figure 3:
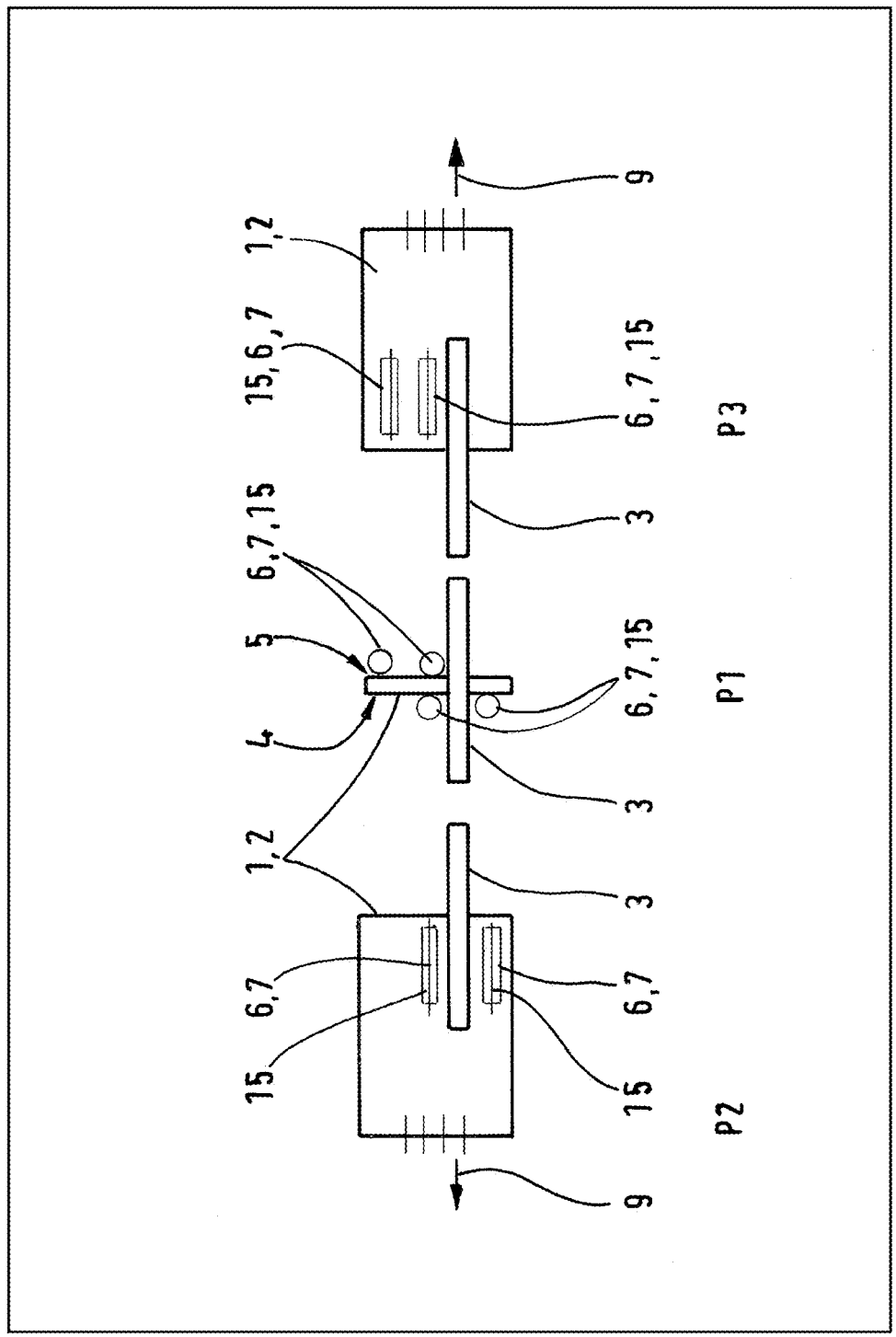
FIG. 3 shows a support element connected onto the current transferring conductor.

FIG. 3 shows a partial view p 1, wherein the support element 1, 2 is clipped onto the current transferring conductor 3.

The support element 1, 2 shows two faces 4, 5.

Each of the face 4, 5 carries two sensing coils 6, 7.

On the face 4 of the support element 1, 2 the sensing coils 6, 7 are arranged on either side of the current transferring conductor 3.

On the face 5 of the support element 1, 2 the sensing coils 6, 7 are arranged on one side of the current transferring conductor 3 relative to the longitudinal axis 9 of the current transferring conductor 3.

The partial view p 2 of FIG. 3 shows a side view of the partial view p 1 of the FIG. 3.

In the partial view p 2 on the face 4 of the support element 1, 2 there are sensing coils 6, 7.

The sensing coils 6, 7 are arranged parallel relative to the current transferring conductor 3.

In the partial view p 2 of FIG. 3, relative to the longitudinal axis 9, the sensing coils 6 and 7 are arranged on either side of the current transferring conductor 3.

The partial view p 3 of FIG. 3 shows the support element 1, 2 with the sensing coils 6 and 7 being arranged on one side of the current transferring conductor 3 relative to the longitudinal axis 9 of the current transferring conductor 3.

Figure 4:
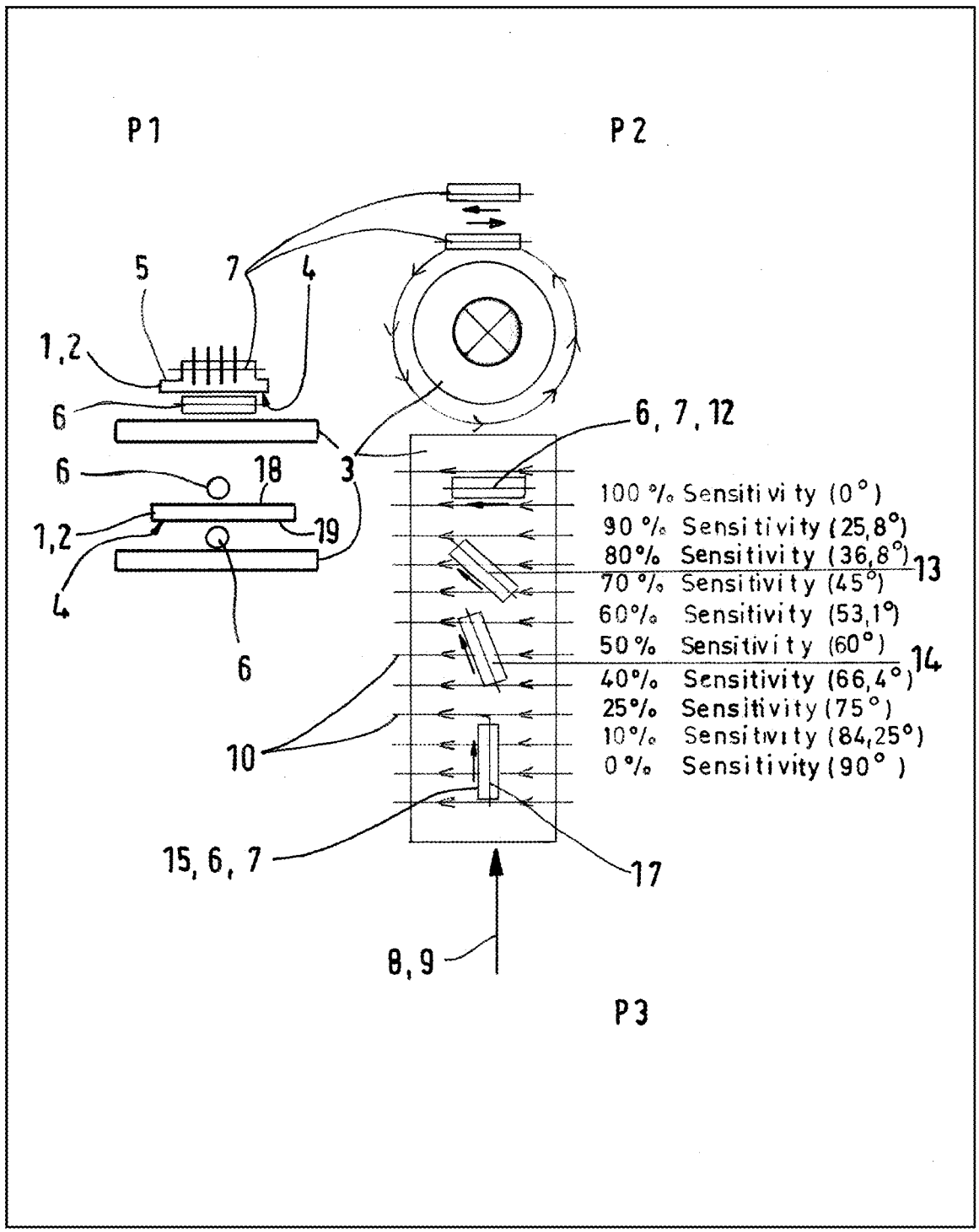
FIG. 4 shows a current transferring conductor and one support element which carries one sensing coil on each face.

FIG. 4 shows partial views p 1, p 2 and p 3 similar to the partial views p 1, p 2 and p 3 shown in FIG. 1.

The partial views p 1, p 2 and p 3 of FIG. 4 differ in that there is only one support element 1, 2 arranged on one side of the current transferring conductor 3.

In the partial views p 1 and p 2 of FIG. 4 the support element 1, 2 is arranged on one side of the current transferring conductor 3.

However, the support element 1, 2 shows one sensing coil 6 and 7 on each of its faces 4, 5 respectively.

In the partial views p 1 and p 2 of FIG. 4 the face 4 of the support element 1, 2 is directed towards the current transferring conductor 3.

The face 5 of the support element 1, 2 is looking away from the current transferring conductor 3.

Thus, the radial distance of the sensing coil 6 relative to the current transferring conductor 3 is smaller than the radial distance of the sensing coil 7 relative to the current transferring conductor 3. The sensing coil 7 is positioned on the face 5 of the support element 1, 2.

When the current 8 is flowing through the current transferring conductor 3 along the longitudinal axis 9 of the current transferring conductor 3, a magnetic field 10 is generated.

The arrangement of the sensing coils 6 and 7 on both faces 4 and 5 of the support element 1, 2 leads to a different exposure of the sensing coils 6 and 7 relative to the magnetic field 10.

The different exposure of the sensing coils 6 and 7 to the magnetic field 10 is due to the angular orientation of the sensing coils 6 and 7 relative to the current transferring conductor 3 and the magnetic field 10.

Figure 5:
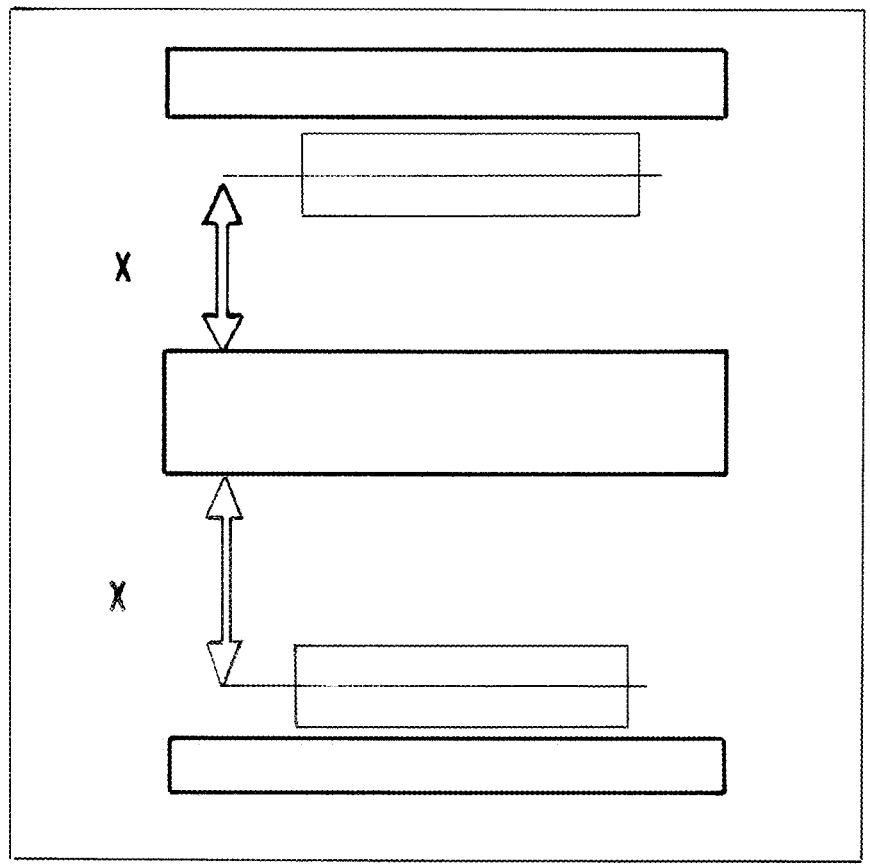
FIG. 5 shows a current transferring conductor providing one coil arranged on either side of the current transferring conductor, with the coils being spaced from the current transferring conductor, respectively.

FIG. 5 shows a current transferring conductor 3 on both sides of which one support element 1, 2 is arranged, respectively.

Each support element 1, 2 carries an individual sensing coil 6, 7 arranged on the face 4, 5 of the support element 1, 2 looking towards the current transferring conductor 3.

Both support elements 1, 2, are spaced from the current transferring conductor 3. Thus, the individual sensing coils 6, 7 are also arranged at a distance to the current transferring conductor 3.

Figure 6:
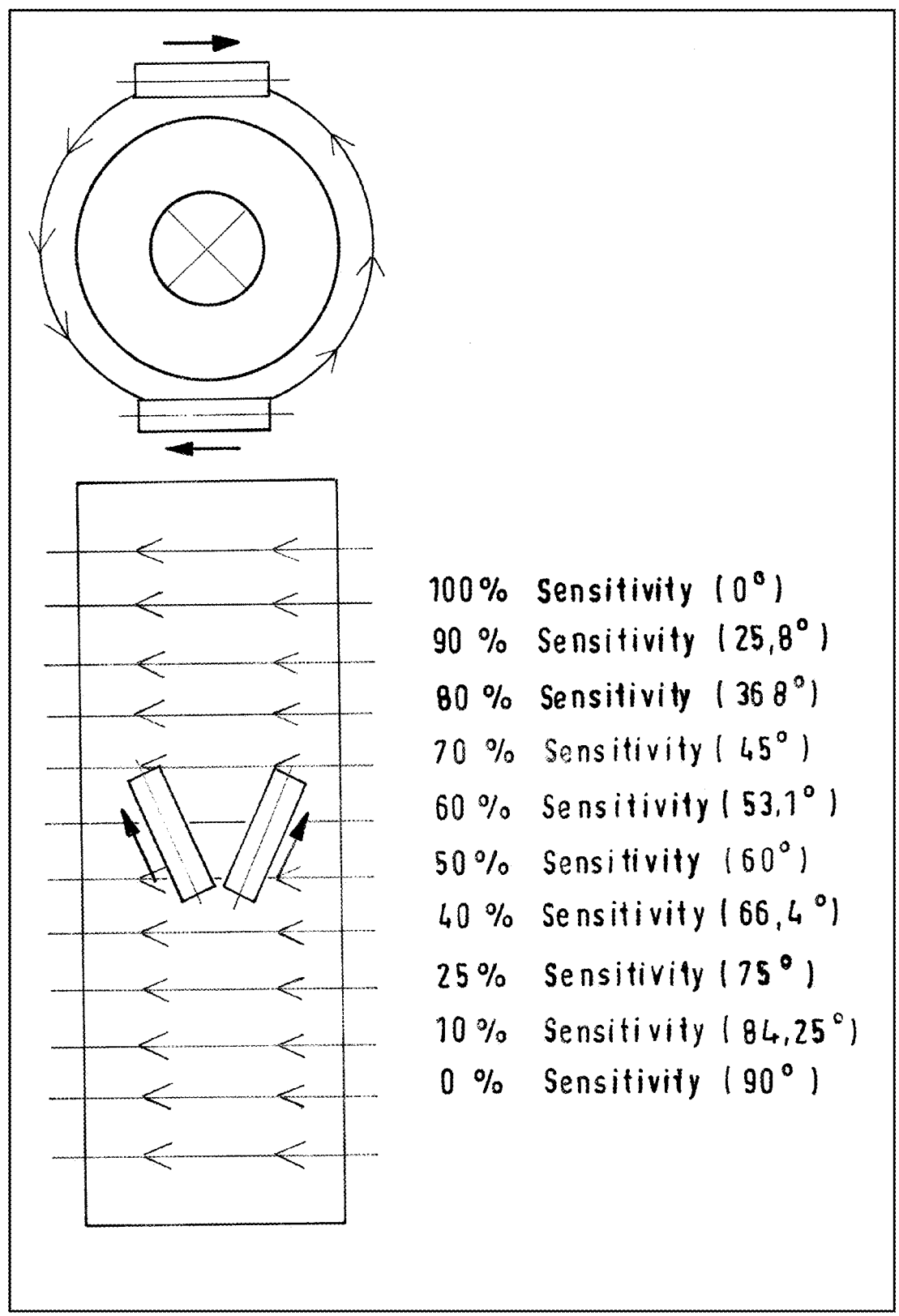
FIG. 6 shows a current sensor having two sensing coils which are arranged in a transverse manner, relative to the longitudinal axis of the current transferring conductor.

FIG. 6 shows a current sensor having two sensing coils 6, 7 which are arranged next to each other, axially symmetrical to the longitudinal axis 9 of the current transferring conductor 3.

FIG. 6 shows two sensing coils arranged in a pair relative to the busbar. A first sensing coil of the pair of the sensing coils is positioned at an inclination angle relative to the longitudinal axis of the busbar.

In order to position the second sensing coil of the pair of the sensing coils the inclination angle of the first sensing coil relative to the longitudinal axis of the busbar is mirrored around the longitudinal axis of the busbar.

Relative to the longitudinal axis of the busbar the inclination angles of the first and the second sensing coils relative to the longitudinal axis of the busbar are equal.

Mirroring the inclination angle of the first sensing coil around the longitudinal axis of the busbar leads to a mirrored inclination angle of the second sensing coil.

The inclination angles of the both sensing coils (first sensing coil and second sensing coil) are of the same size but have opposite signs.

As an effect, mirroring the inclination angle around the longitudinal axis of the busbar leads to opposite measurement signals of the sensing coils relative to the busbar.

The sensing coil frequently comes with a core arranged in a bobbin. The space between the core and the bobbin may lead to an inaccuracy of the results of the measurement performed by the sensing coil.

A further inaccuracy is due to the angle between the two sensing coils (first sensing coil and second sensing coil). The inclination angles of the first sensing coil and the second sensing coil relative to the longitudinal axis of the busbar are of the same size but have opposite signs. The greater the angle between the two coils, the greater the measurement inaccuracy of the coils.

The measurement inaccuracies are mathematically eliminated by subtracting the measurement results of the first and the second sensing coils from one another. The subtraction of the measurement results of the individual sensing coils leads to the mathematical elimination of the mechanical inaccuracy that may arise as a result of the physical arrangement of the sensing coil relative to the busbar and/or as a result of the space between the core and the bobbin.

By reducing the angle between the sensing coils having mirrored inclination angles around the longitudinal axis of the busbar, the influence of an external magnetic field on the sensing coils (first and second sensing coils) is significantly reduced.

The measurement signal of the sensing coil is influenced by an external magnetic field resulting in a magnetic noise disturbance influencing the measurement signal of the sensing coil. The subtraction of the measurement results of the individual sensing coils helps to further improve the so called signal to noise ratio.

Figure 7:
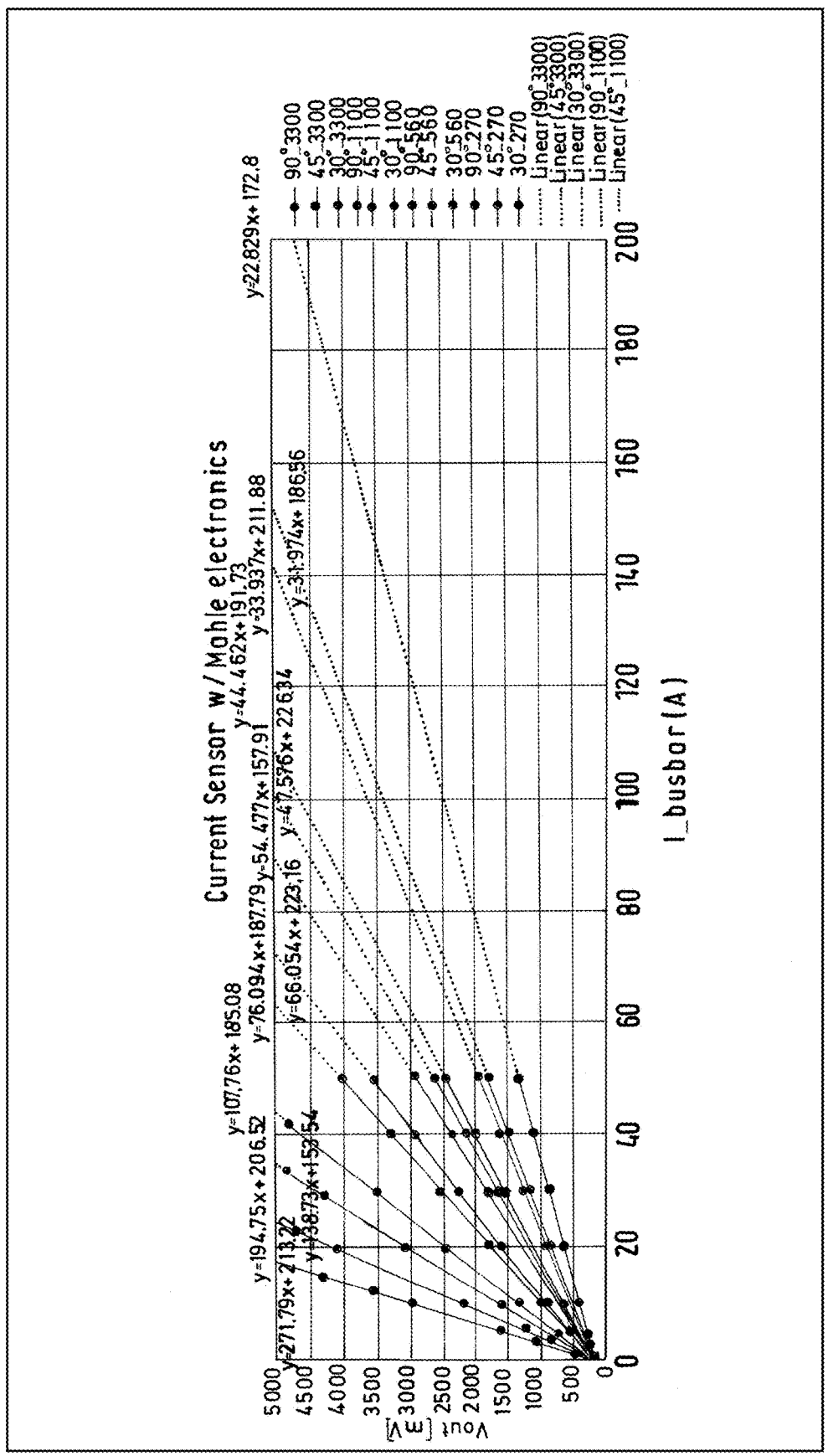
FIG. 7 refers back to FIG. 1, comprising a coordinate system providing the results of the measurement under the conditions of the arrangement of the sensing coils shown in FIG. 1.

FIG. 7 shows a coordinate system representing the results of the measurement done by the sensing coils 6, 7. In FIG. 7 a current with different Ampere values (A) is applied to the current transferring conductor 3.

The Ampere values (A) are plotted on the X-axis of the coordinate system.

The corresponding output voltage values (Vout; in mV) are shown on the Y-axis.

Different curves are shown in the coordinate system of FIG. 7. The individual curves represent different coils 6, 7.

Each coil 6, 7 has a different angular orientation 12, 13, 14, 15 relative to the current transferring conductor 3.

In the example of FIG. 7 each sensing coil 6, 7 has a resistance of 27 Ohm, 56 Ohm, 110 Ohm or 330 Ohm respectively.

Thus, depending on the angular orientation of the sensing coils 6, 7 relative to the current transferring conductor 3 each sensing coil 6, 7 has different output voltage values (Vout; in mV).

Figure 8:
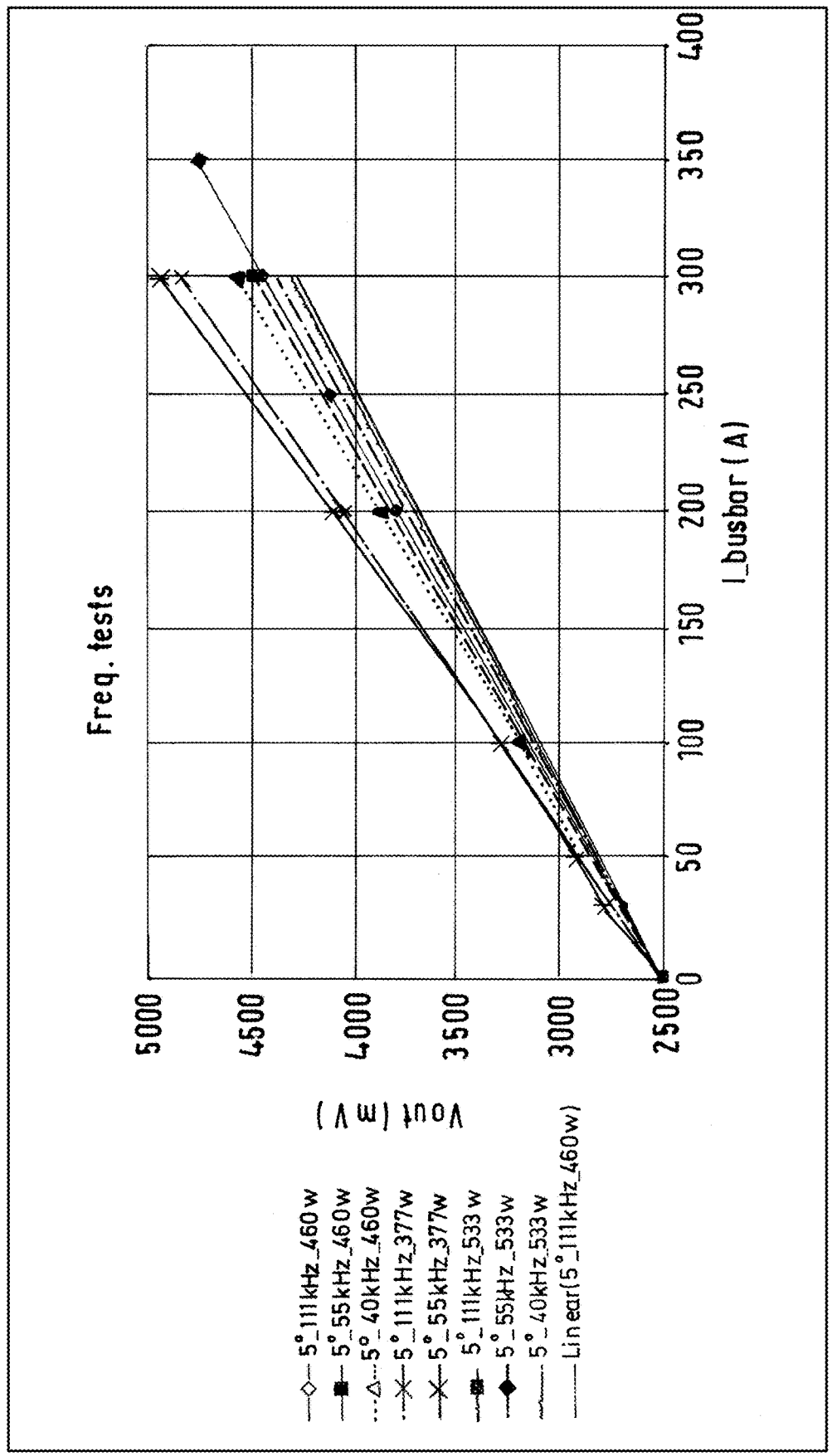
FIG. 8 shows the results of a frequency test done under the conditions of the FIG. 1.

FIG. 8 refers to FIG. 1 showing the results of a frequency (w) test the coils 6, 7 shown in FIG. 1 are subjected to.

On the X-axis of FIG. 8 the current in Ampere (A) ranges from 0 A to 400 A.

The Y-axis gives the corresponding output voltage values (Vout; in mV).

Each curve shown in FIG. 8 represents a different mains frequency.

The mains frequency is the frequency of the electric energy supply by means of an alternating voltage in the electricity network.

In FIG. 8 the frequency test is performed referring to a sensing coil 6, 7 having an angular orientation relative to the longitudinal axis 9 of 5°.

Figure 9:
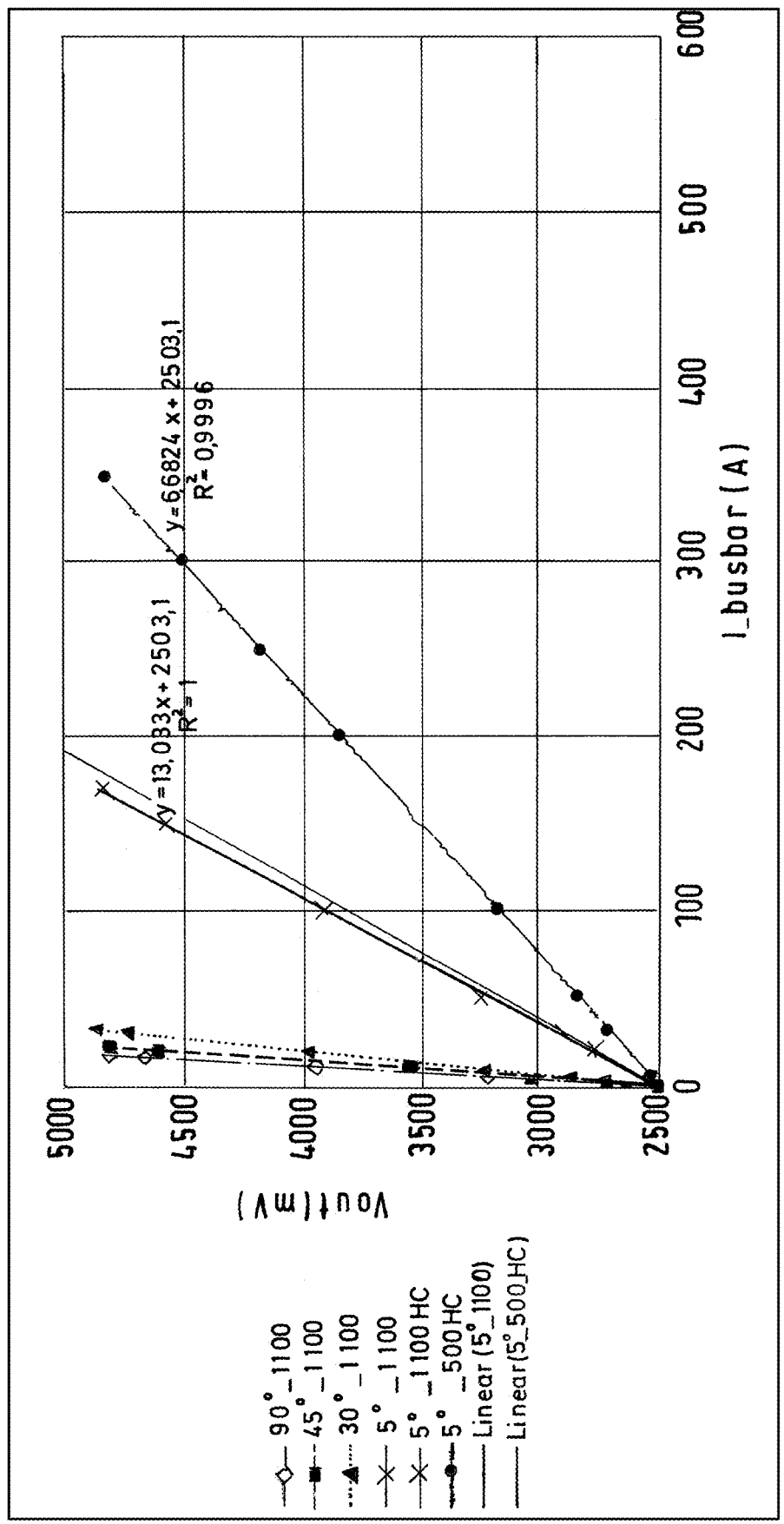
FIG. 9 refers back to FIG. 1, providing the results of the measurement under the conditions of the arrangement of the sensing coils shown in FIG. 1, with the sensing circuit having a gain resistance of 110 Ohm.

In FIG. 9 Ampere values (A) are plotted on the X-axis, whereas voltage output values (Vout; in mV) are given on the Y-axis.

Each curve of FIG. 9 represents a different angular orientation 12, 13, 14, 15 of the individual sensing coil 6, 7 relative to the longitudinal axis 9 of the current transferring conductor 3.

In FIG. 9 the angular orientation of the sensing coil 6, 7 relative to the longitudinal axis 9 of the current transferring conductor 3 ranges from a 5° angle to a 90° angle.

Figure 10:
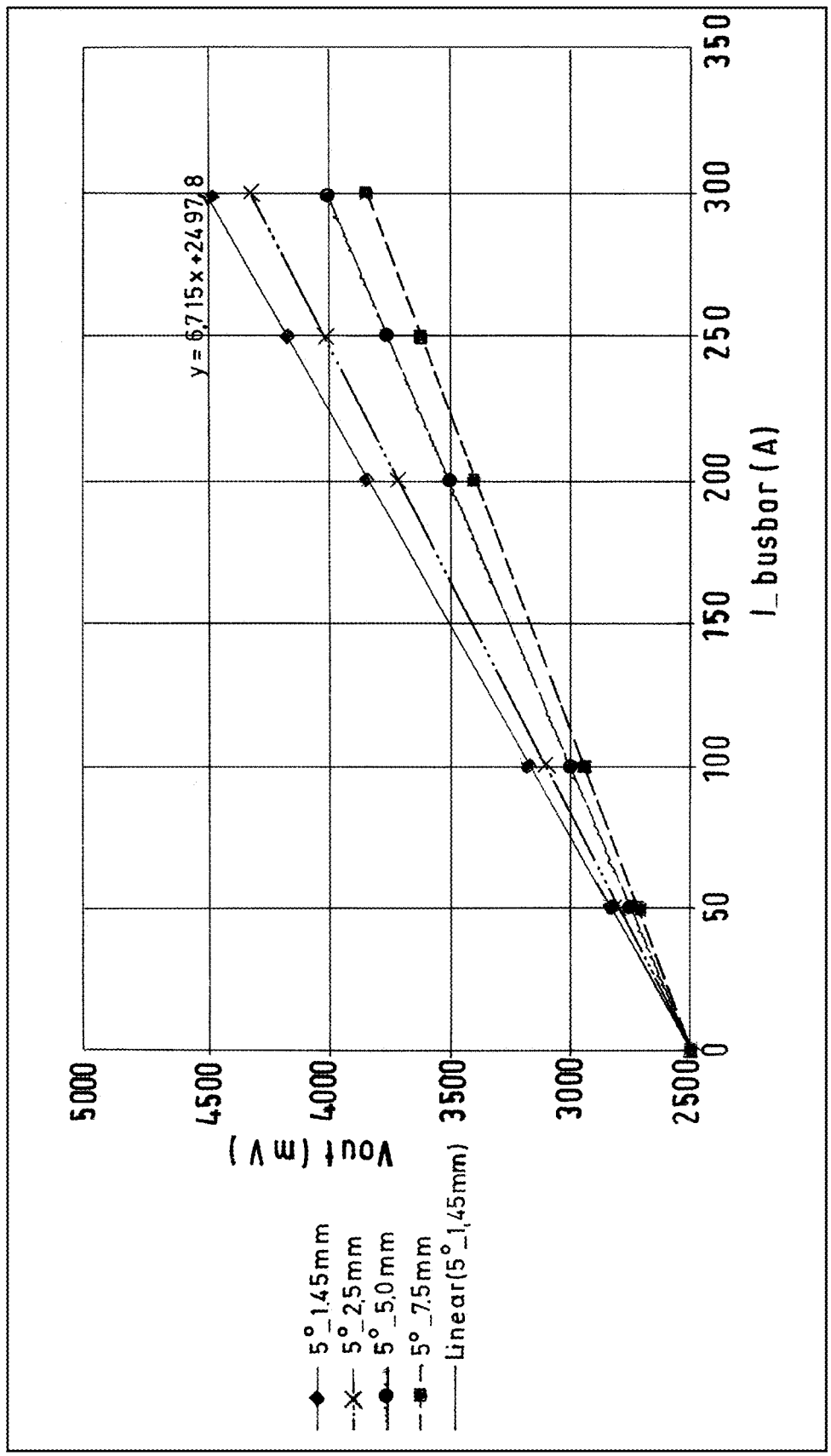
FIG. 10 refers back to FIG. 1, showing the results of a height test.

FIG. 10 shows a high test with coils 6, 7 having an angular orientation of 5° relative to the longitudinal axis 9 of the current transferring conductor 3.

The different curves of FIG. 10 represent vertical distances of the sensing coil 6, 7 relative to the current transferring conductor 3 ranging from 1.45 mm to 7.5 mm.

Figure 11:
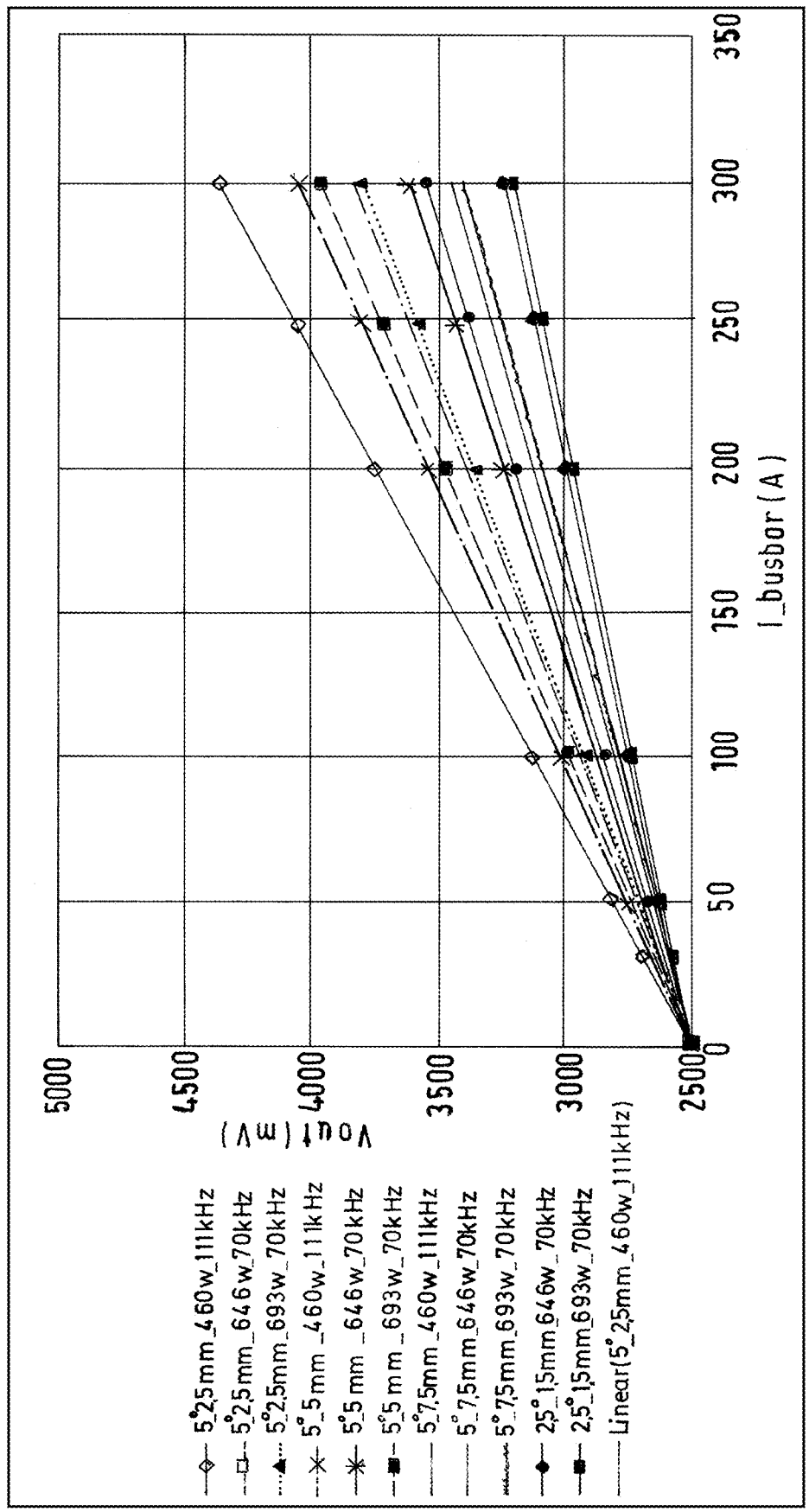
FIG. 11 refers back to FIG. 1, showing the results of a different number of winding coils comparison.

FIG. 11 shows a comparison of different number of winding coils 5, 6.

The curves of FIG. 11 represent various vertical distances of the individual coil 6, 7 relative to the current transferring conductor 3. The vertical distances range from 1.5 mm to 2.5 mm to 5 mm and to 7.5 mm.

Each curve of FIG. 11 is associated with one of the vertical distances referred to above.

The curves of FIG. 11 are divided into four groups.

First group: vertical distance 2.5 mm

Second group: vertical distance 5 mm

Third group: vertical distance 7.5 mm

Fourth group: vertical distance 1.5 mm.

Also, each group of the vertical distances refers to coils 6, 7 having different numbers of windings.

Within each group of vertical distances, the coils 6, 7 refer to different mains frequencies.

Figure 12:
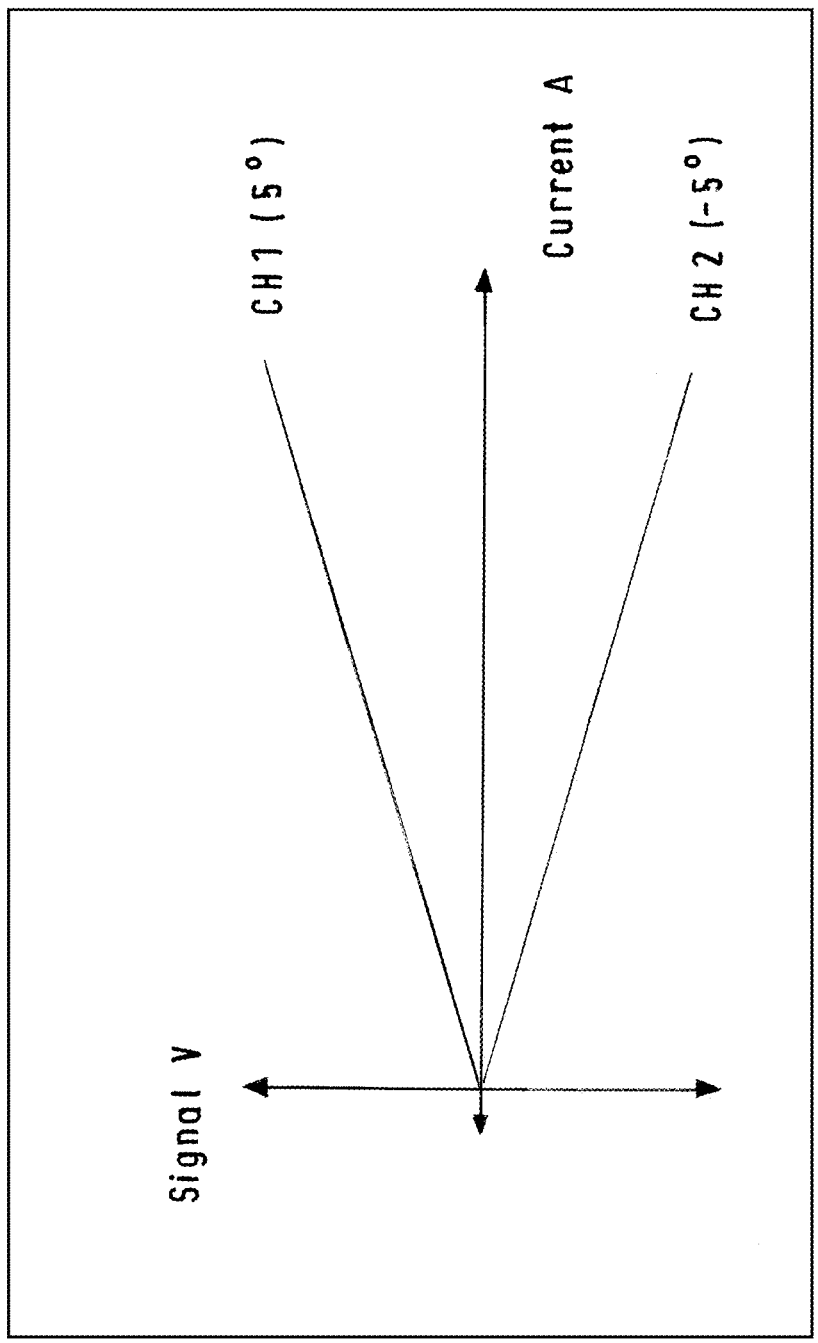
FIG. 12 refers back to FIG. 1, showing the output signal behaviour of the sensing coil.

FIG. 12 shows a coordinate system, referring to two sensing coils 6, 7 being arranged transverse to the longitudinal axis 9 of the current transferring conductor 3.

In accordance with FIG. 12, the curves CH1 and CH2 refer to the coils 6 and 7 respectively.

In FIG. 12 the values plotted on the X-axis show Ampere values (A) of a current.

On the Y-axis the corresponding voltage (V) is shown.

Curve CH1 refers to the coil 6 having an angular orientation relative to the longitudinal axis 9 of the current transferring conductor 3 of 5°.

The curve CH2 represents a coil 7, with the coil 7 having an angular orientation relative to the longitudinal axis 9 of the current transferring conductor 3 of −5°.

Figure 13:
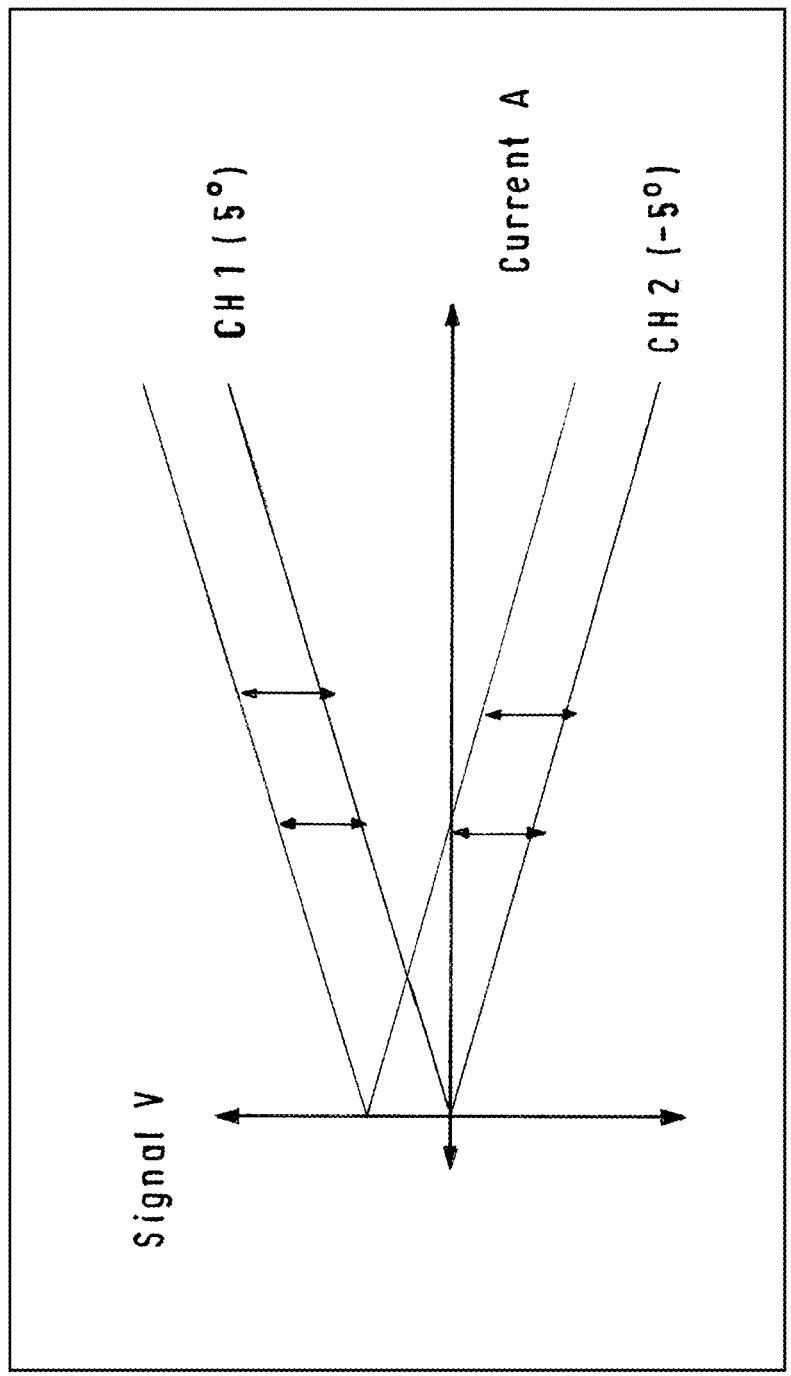
FIG. 13 refers back to FIG. 1, showing the output signal behaviour of the sensing coil being influenced by an external magnetic field.

In addition, to FIG. 12, in FIG. 13, both curves CH1 and CH2 are shifted in parallel.

The parallel curves CH1' and CH2' show that both sensing coils 6 and 7 respectively, are exposed to an external magnetic influence.

Figure 14:
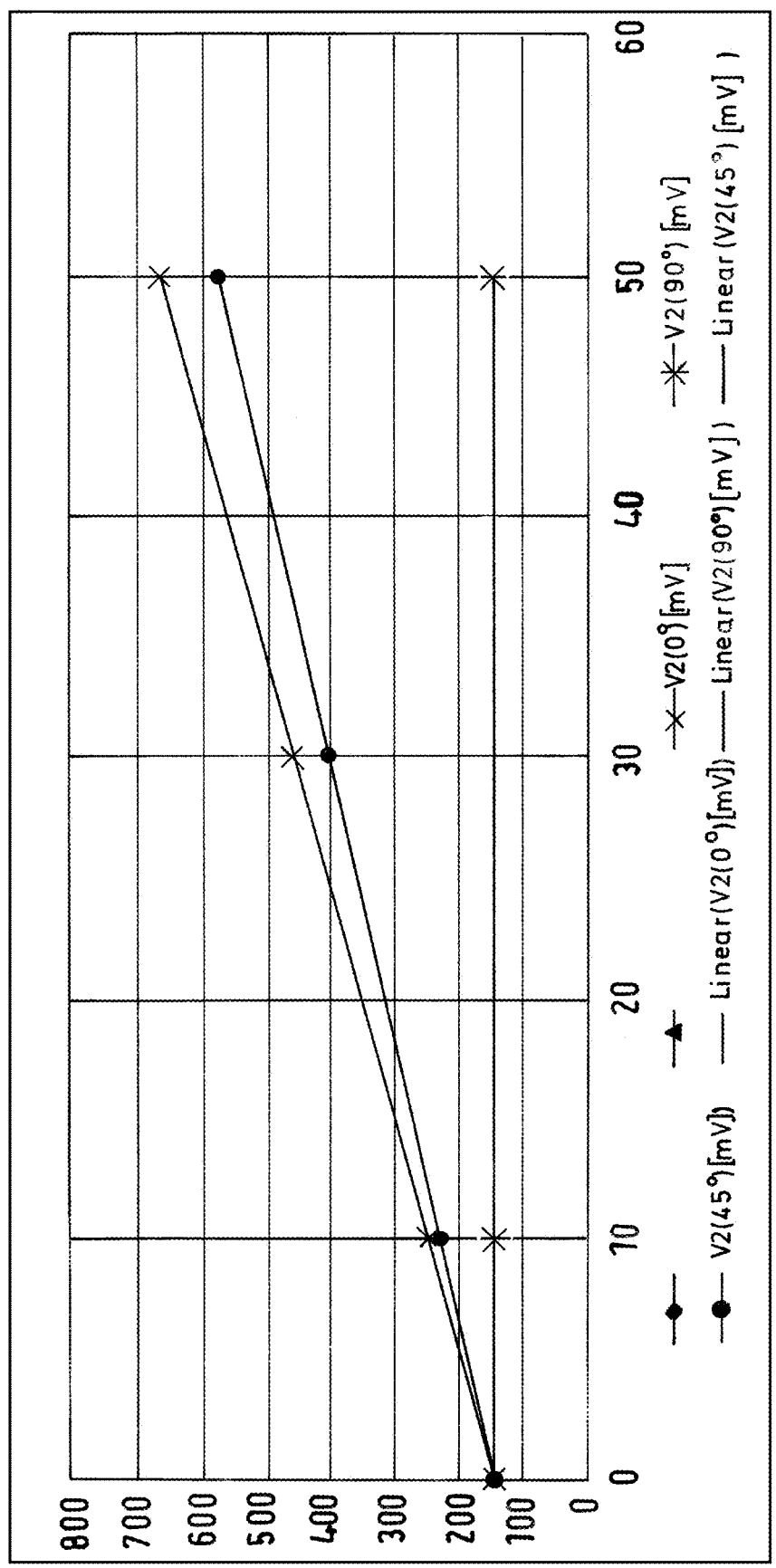
FIG. 14 refers back to FIG. 2, comprising a coordinate system providing the results of the measurement under the condition of the arrangement of the sensing coils shown in FIG. 2.

FIG. 14 refers to the sensing coils 6, 7 extending through a bore 16 provided in the current transferring conductor 3 (see FIG. 2 above).

The degrees (°) of the angular orientation of the sensing coil 6, 7 relative to the longitudinal axis 9 of the current transferring conductor 3 is plotted on the X-axis.

On the Y-axis Ampere values of the current flowing through the current transferring conductor 3 are shown.

The Ampere values (A) on the Y-axis start at approximately 150 A.

Figure 15:
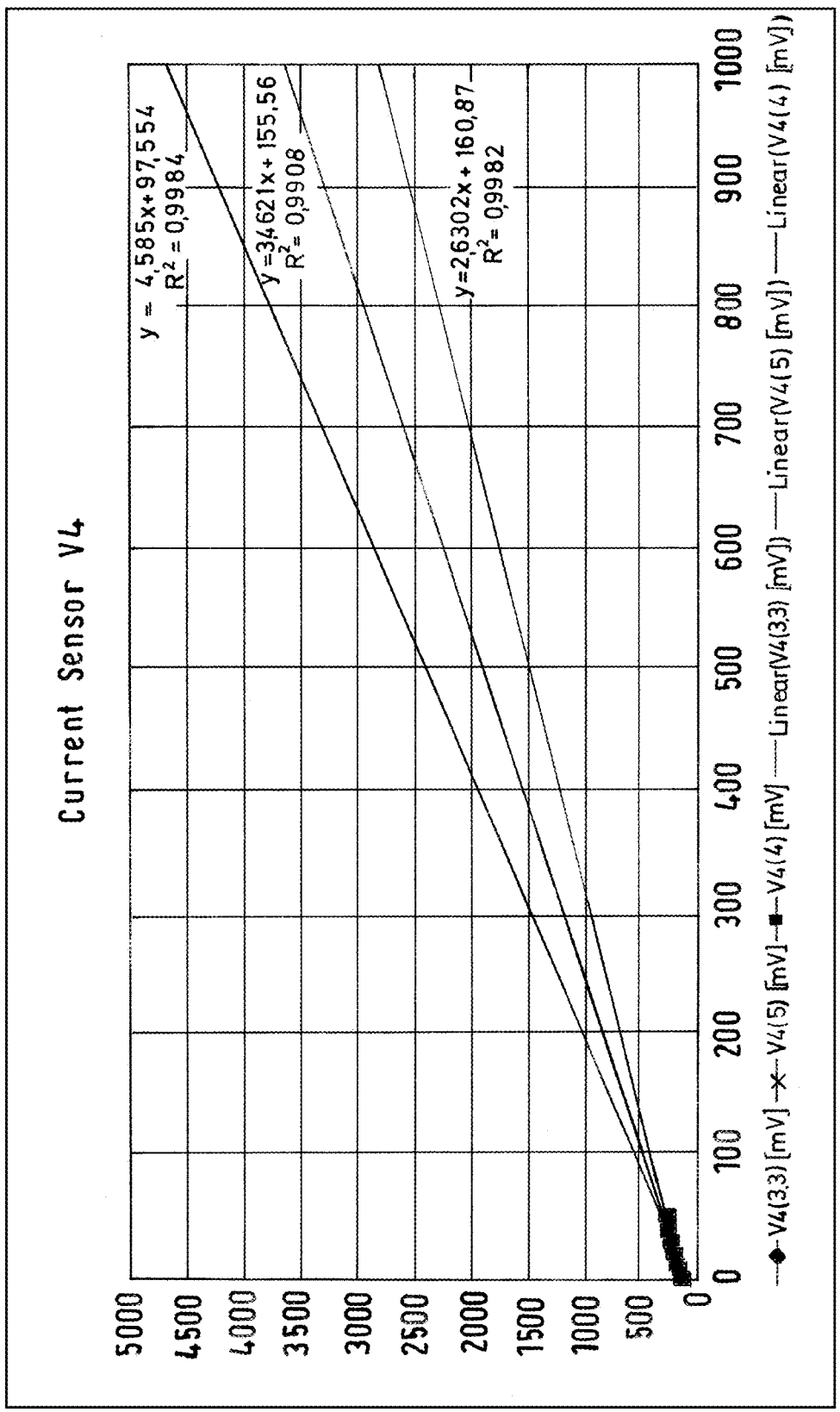
FIG. 15 refers back to FIG. 4, comprising a coordinate system providing the results of the measurement under the condition of the arrangement of the sensing coils shown in FIG. 4.

On the X-axis of FIG. 15 the current is represented in Ampere (A) wherein the Y-axis shows voltage output values (Vout; in mV).

The curves shown in FIG. 15 represent voltage output values (Vout; in mV) depending on the different angular orientation of the sensing coils 6, 7 with respect to the current transferring conductor 3.

Figure 16:
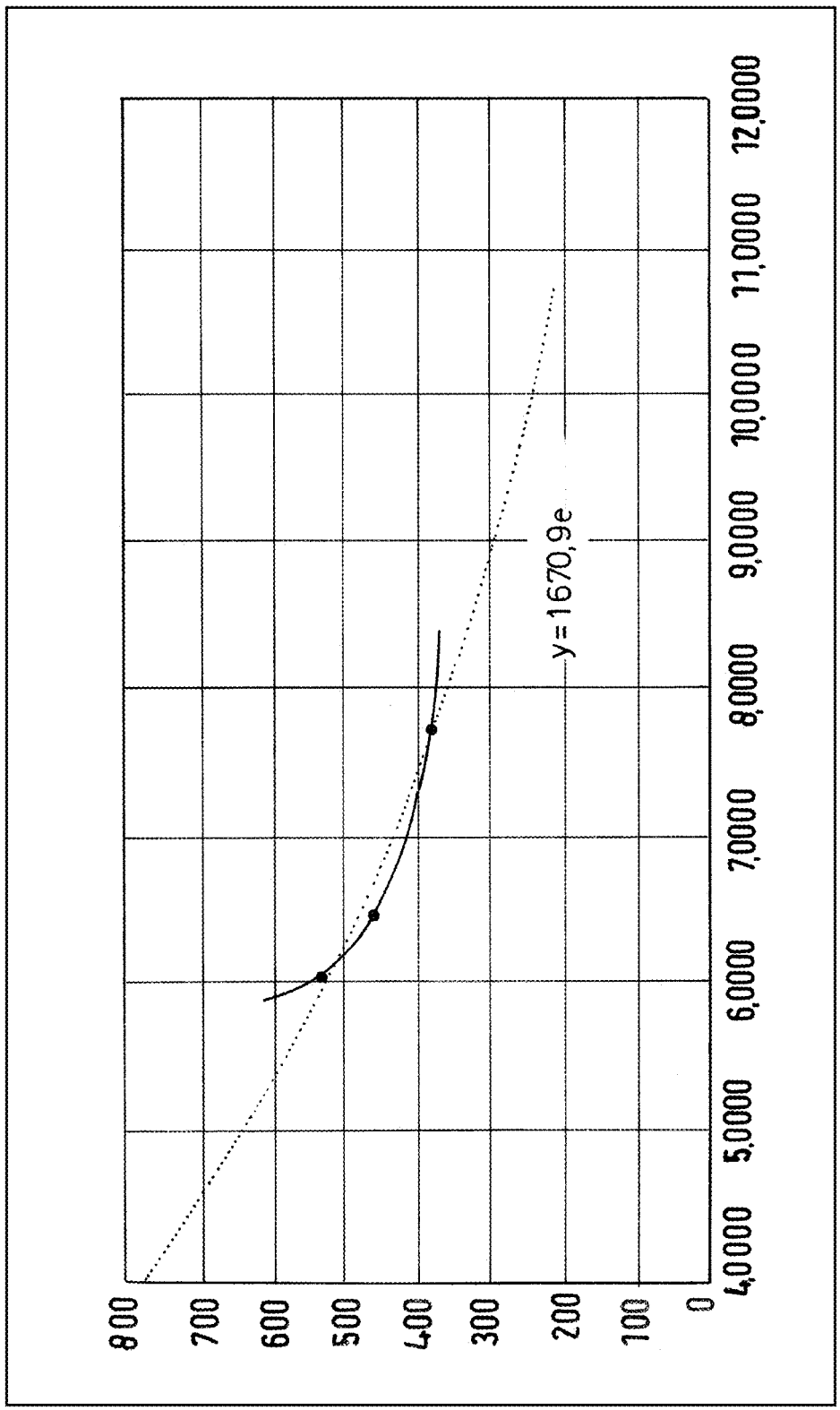
FIG. 16 shows a coordinate system providing the expected winding sensitivity of a sensing coil.

The expected winding sensitivity of the coils 6, 7 is shown in FIG. 16.

Figure 17:
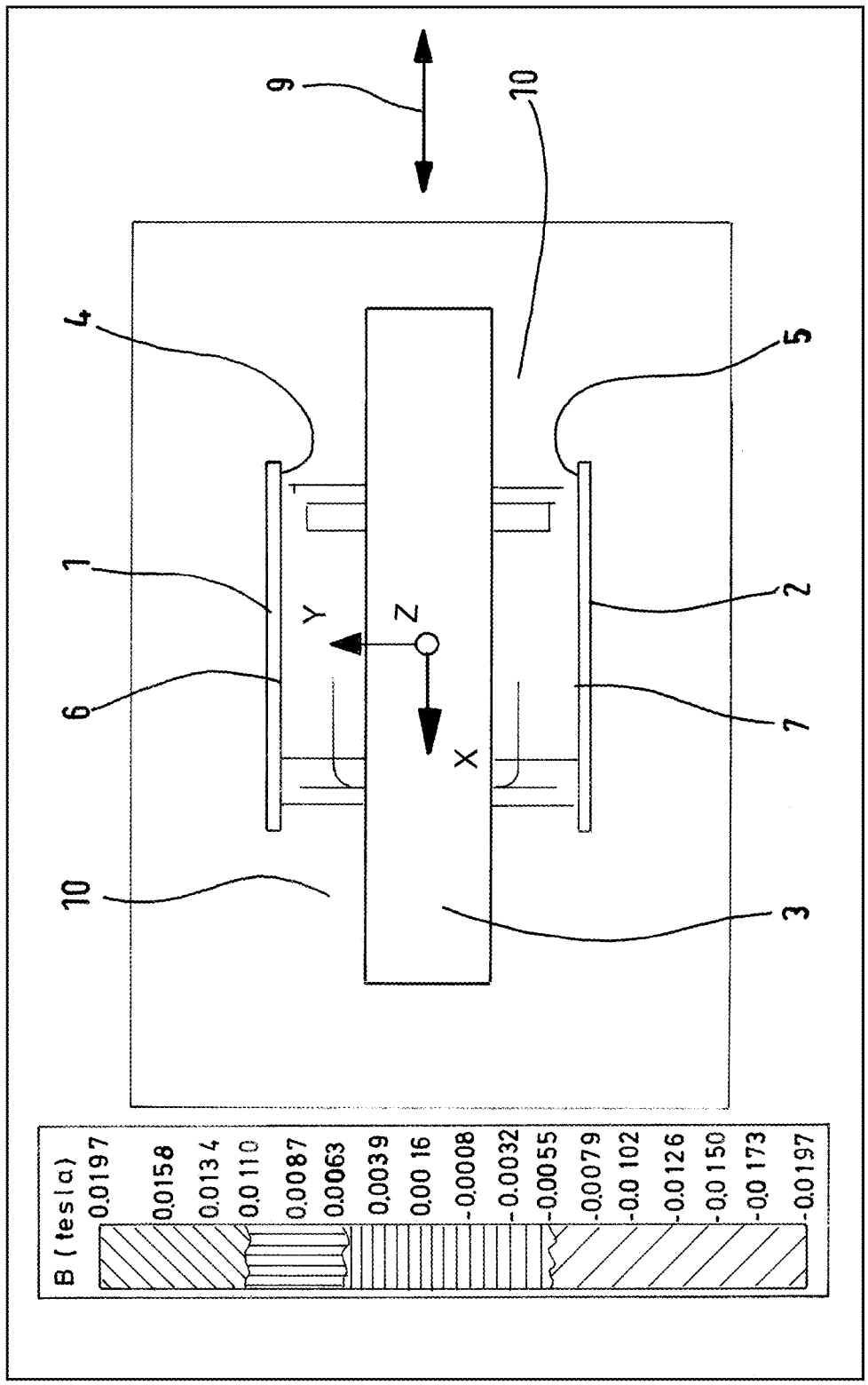
FIG. 17 refers back to FIG. 1 and shows the lines of the magnetic field extending radially relative to the longitudinal axis of the current transferring conductor.

FIG. 17 shows the current transferring conductor 3, cut transversely.

On the faces 4 and 5 of the support elements 1 and 2 one can see sensing coils 6 and 7.

The lines of the magnetic field 10 extend radially relative to the longitudinal axis 9 of the current transferring conductor 3.

The magnetic flux density is given in tesla (B) according to the column on the left.

The arrows shown in FIG. 17 represent the direction of the flow of the lines of the magnetic field 10.

Figure 18:
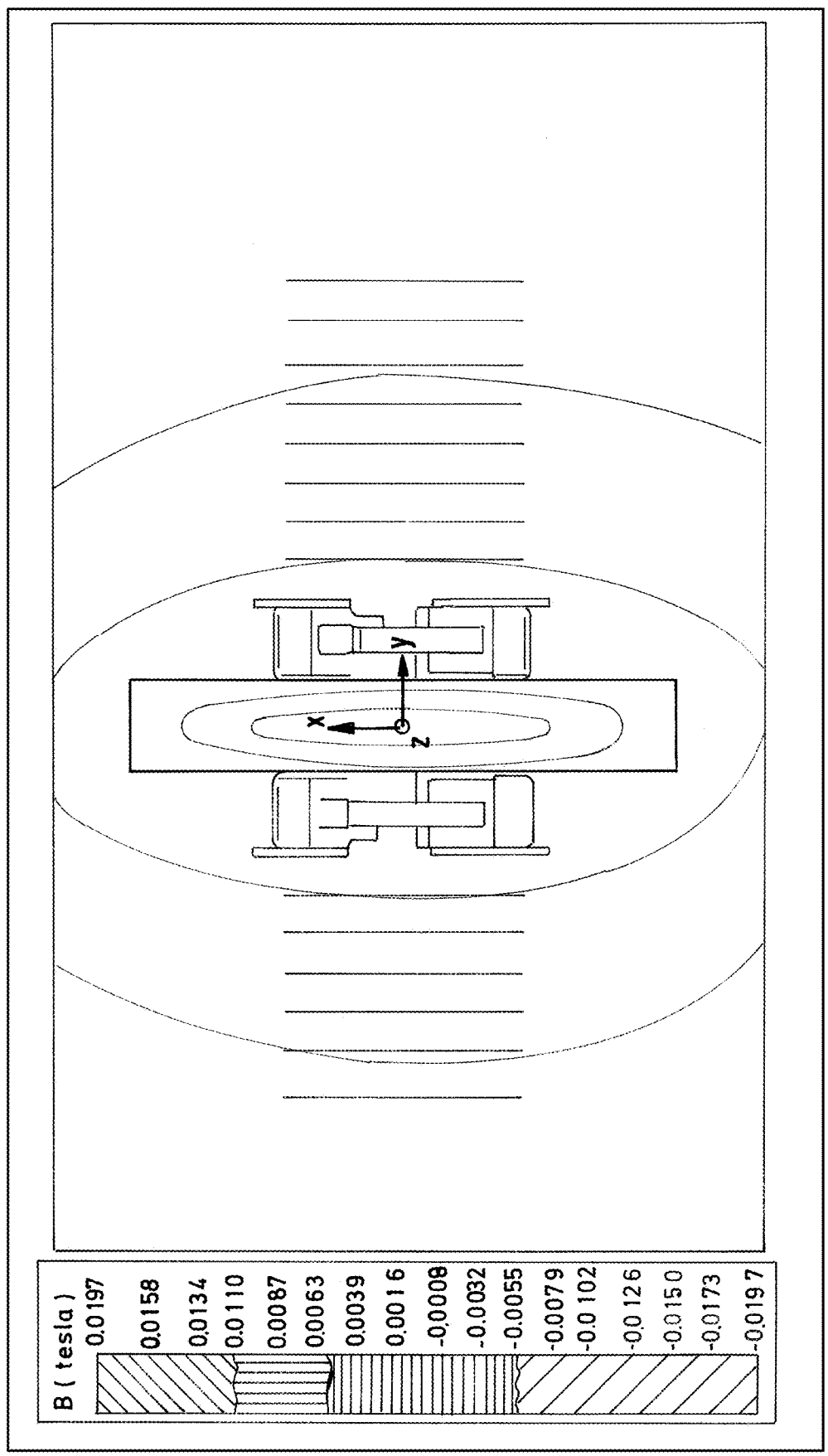
FIG. 18 shows the values of the magnetic flux density along the core of a sensing coil both in the direction of the arrow X and in direction of the arrow Y.

FIG. 18 differs from FIG. 17 in that FIG. 18 shows the magnetic flux density (B) of the magnetic field 10.

The values of the magnetic flux density (B) of the magnetic field 10 are given in the column on the left of FIG. 13.

FIG. 18 shows the values of the magnetic flux density (B) of all coils 6, 7 involved, both in the direction of the arrow X and in direction of the arrow Y.

Figure 19:
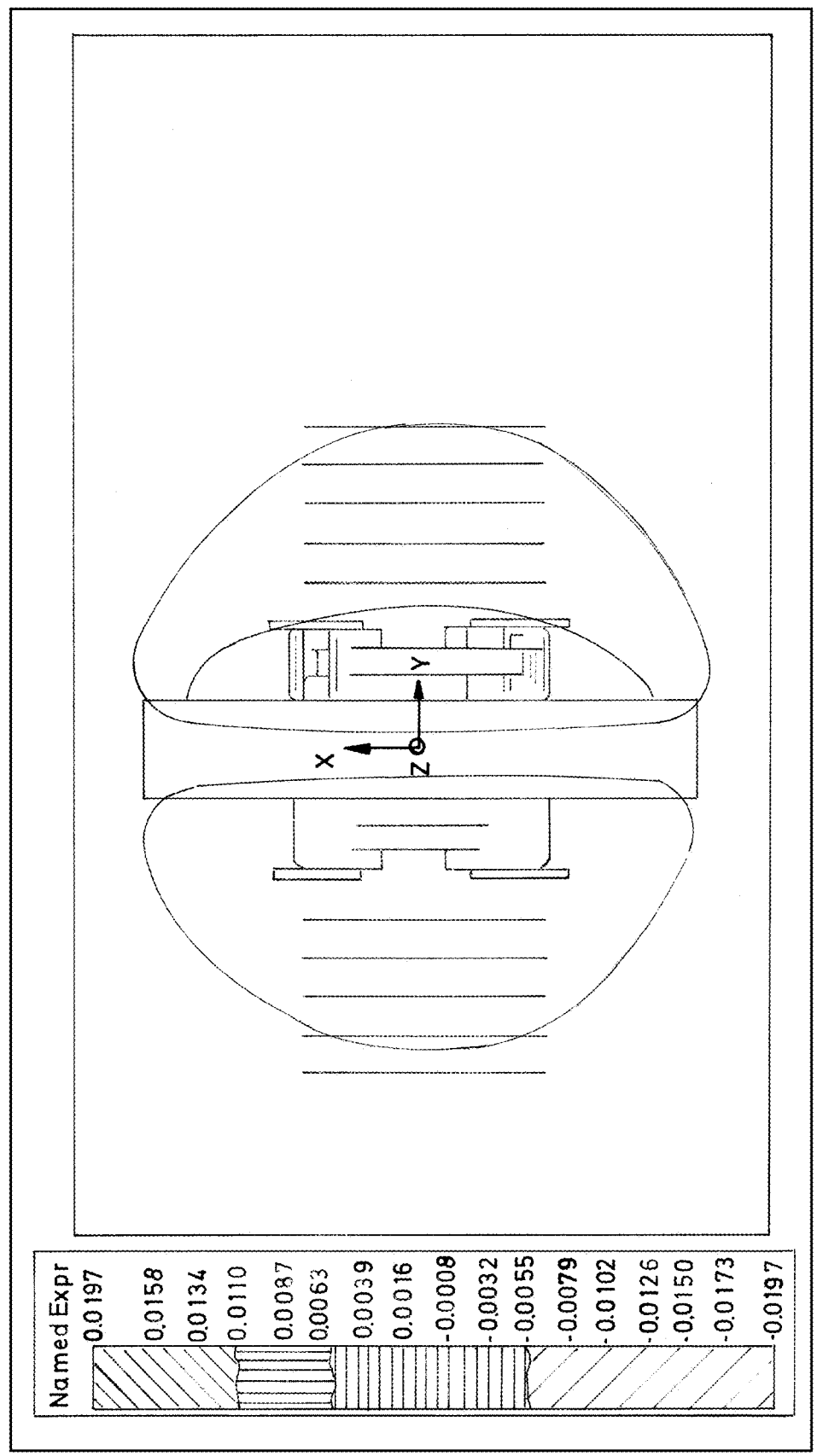
FIG. 19 shows the values of the magnetic flux density along the core of a sensing coil in the direction of the arrow X.

Contrary to FIG. 18, FIG. 19 shows the magnetic flux density plot (B) in the direction of the arrow X of the current transferring conductor 3.

Figure 20:
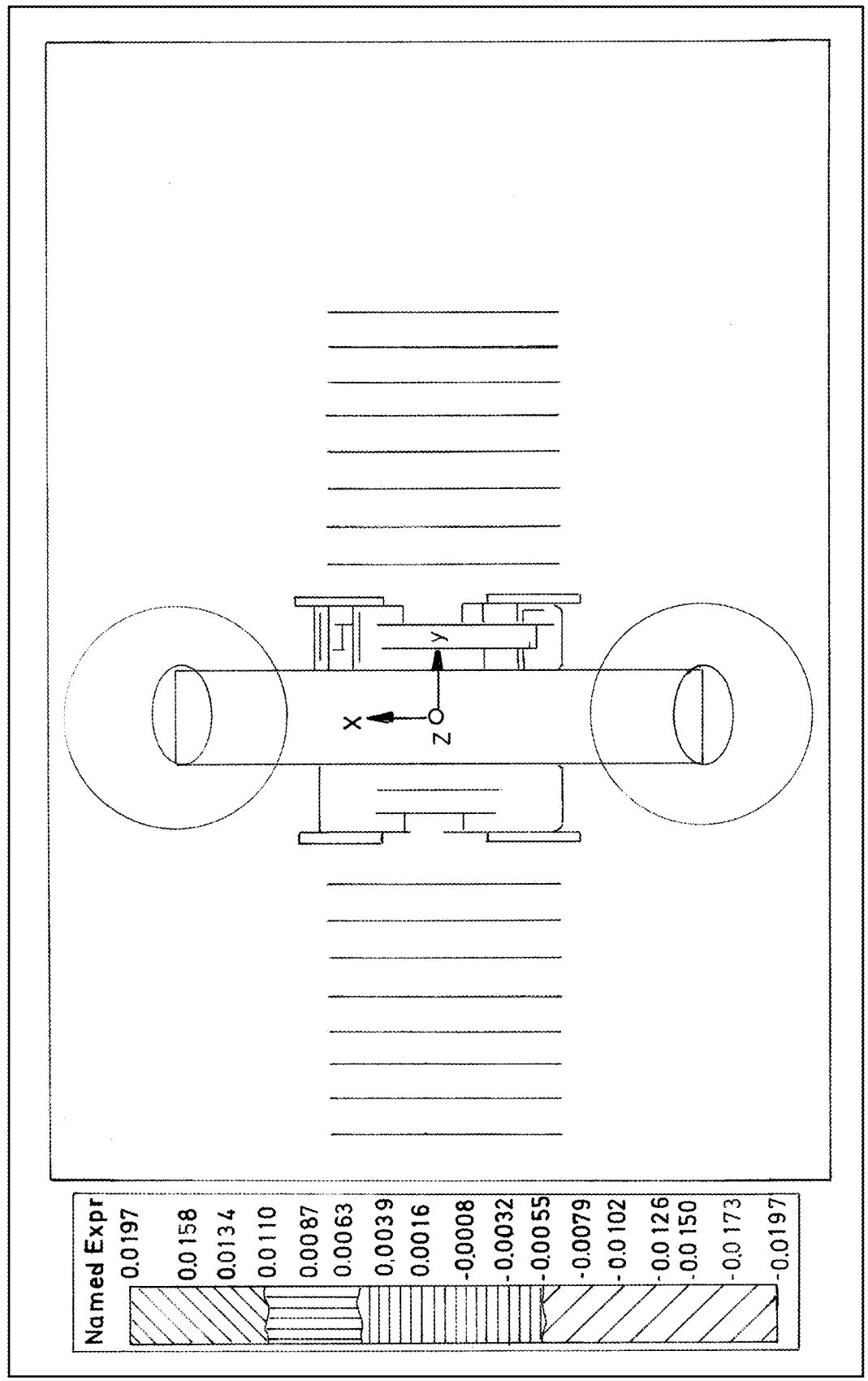
FIG. 20 shows the values of the magnetic flux density along the core of a sensing coil in the direction of the arrow Y.

Contrary to FIG. 18 and contrary to FIG. 19, FIG. 20 shows the values of the magnetic flux density (B) of the magnetic field 10 in the direction of the arrow Y.

Figure 21:
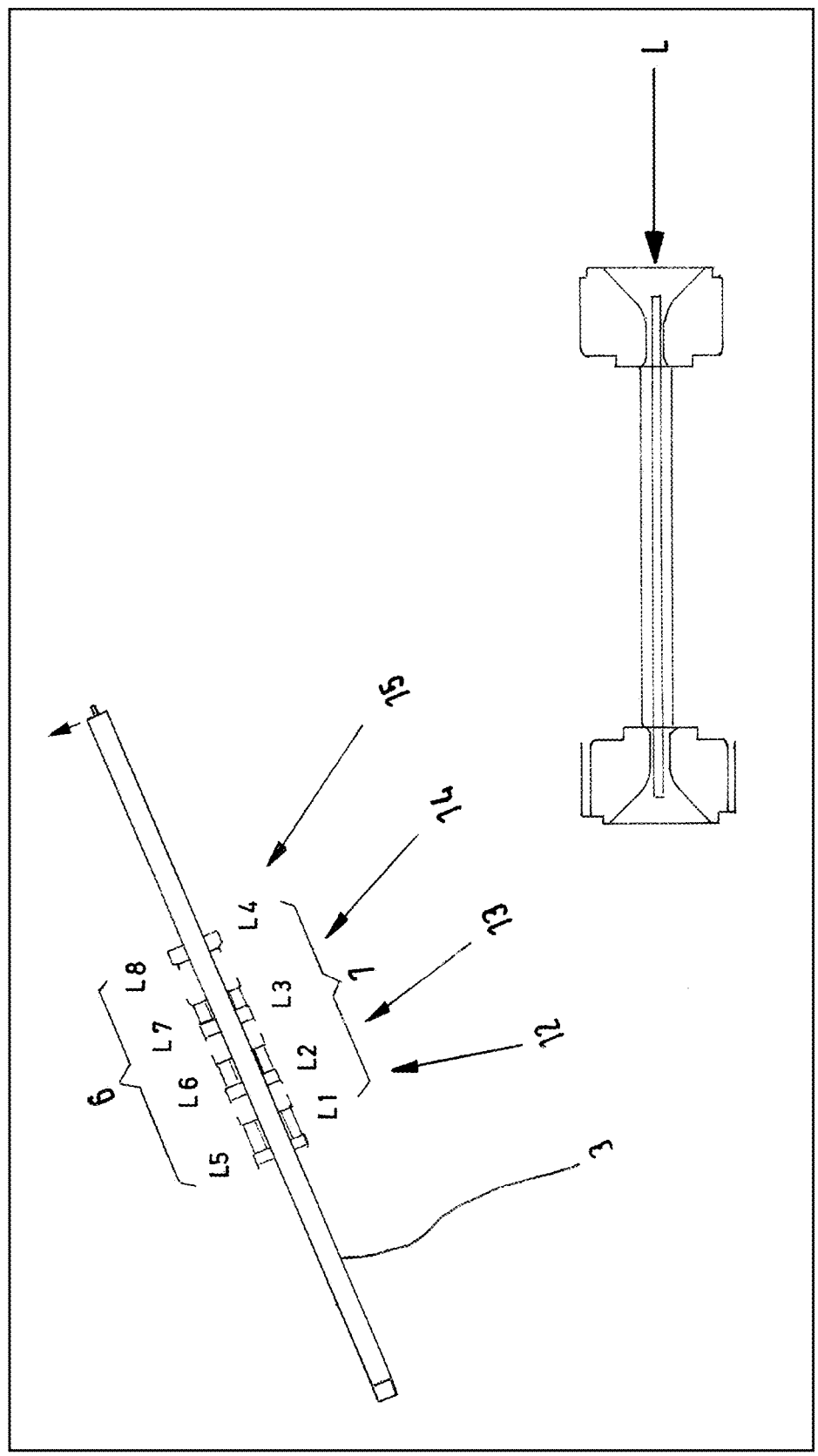
FIG. 21 refers to FIG. 1 and to FIG. 4 showing the current transferring conductor with sensing coils being arranged in different angles of orientation relative to the longitudinal axis of the current transferring conductor.

FIG. 21 shows the current transferring conductor 3 with sensing coils 6 and 7 arranged in the vicinity of the current transferring conductor 3.

Depending on the angular orientation 12, 13, 14, 15 of the individual sensing coils 6, 7, the sensing coils 6, 7 are referred to as L1 and L5; L2 and L6; L3 and L7; L4 and L8.

In FIG. 21, the letter L represents a line in the centre of an A-wire. The magnetic field 10 is measured along the line in the centre of the A-wire.

In the example of FIG. 21 the coils are spaced about 1.45 mm from the surface of the current transferring conductor 3.

Figure 22:
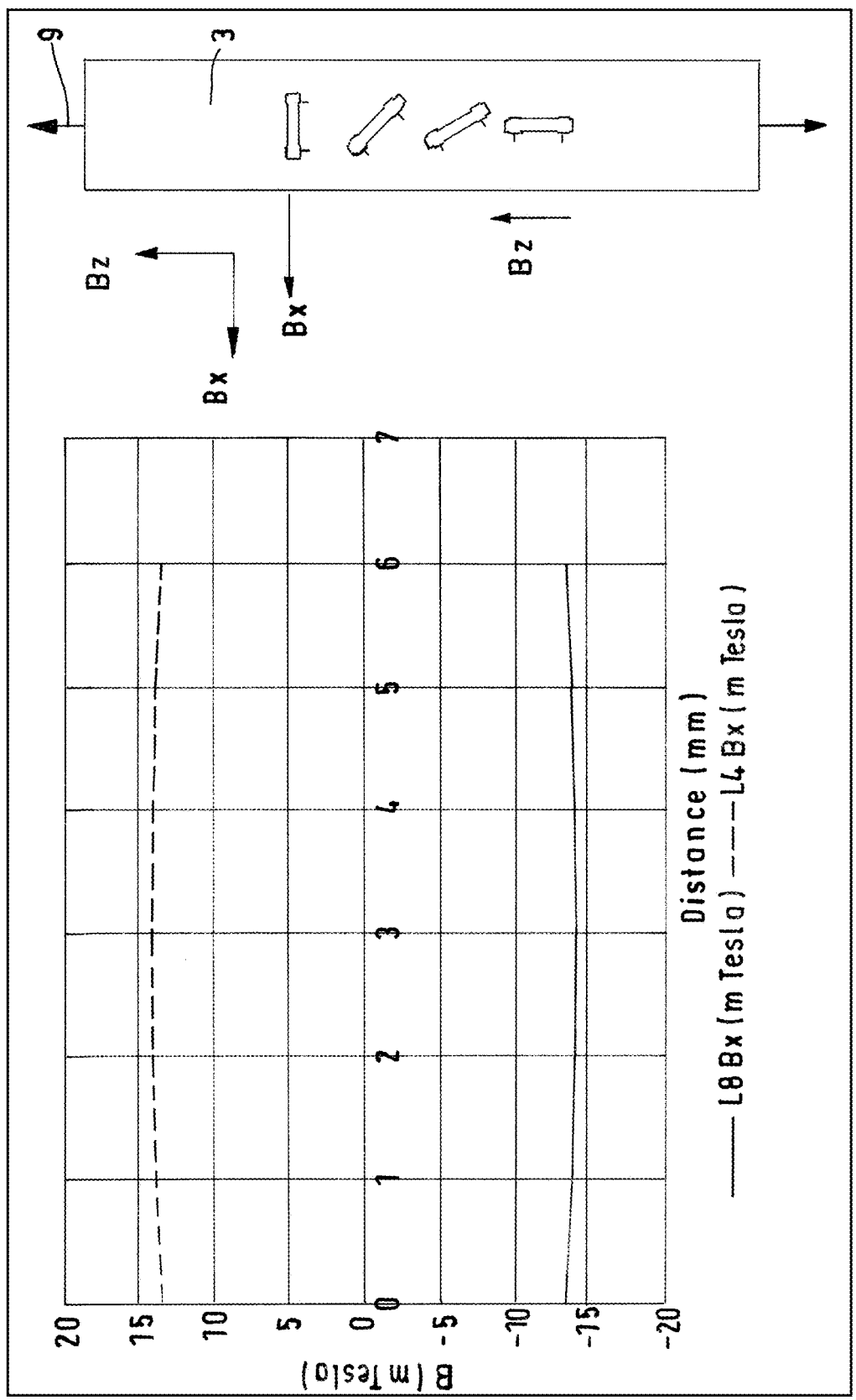
FIG. 22 refers to FIG. 1 and to FIG. 4 showing a dominating field component (Bx) relating to a magnetic field of the current transferring conductor.

FIG. 22 shows the dominating field component (Bx) of the magnetic flux density (B). The dominating field component (Bx) is due to the magnetic field orientation. Wherein the orientation of the magnetic field 10 results from the direction of the current.

The flow of the current is directed along the longitudinal axis 9 of the current transferring conductor 3.

In FIG. 22 the coils L4 and L8 are arranged transverse relative to the longitudinal axis 9 of the current transferring conductor 3.

Also, the coils L4 and L8, shown in FIG. 22 have the same angular orientation relative to the longitudinal axis 9 of the current transferring conductor 3.

Relative to the longitudinal axis 9 of the current transferring conductor 3 one of the coils L4 and L8 is positioned on the upper side of the current transferring conductor 3 whereas the other one of the coils L4 and L8 is positioned on the lower side of the current transferring conductor 3.

Being arranged on the upper side and on the lower side of the current transferring conductor 3, the coils L4 and L8 have an opposite direction of orientation relative to the lines of the magnetic field.

As a result, the coils L4 and L8 have a higher magnetic field of about 140 Gauss.

Contrary to the coils L4 and L8, in FIG. 22 the coils L5 and L1 are arranged in the direction of the longitudinal axis 9 of the current transferring conductor 3.

Due to the direction of orientation of the sensing coils L5 and L1 relative to the lines of the magnetic field, the sensing coils L5 and L1 have the lowest magnetic field 10 of about 0.5 G.

Figure 23:
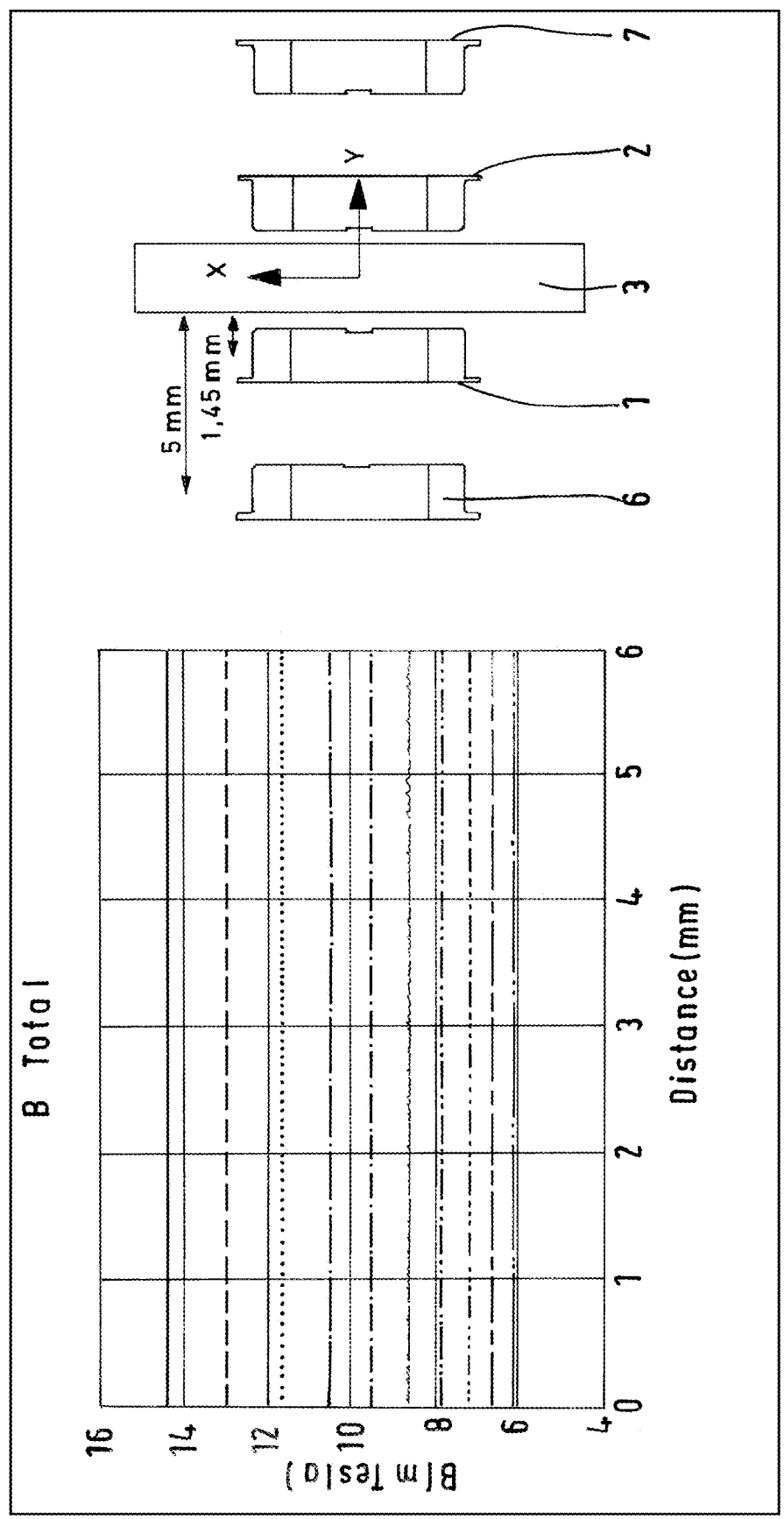
FIG. 23 shows a comparison of field values at different coil positions.

FIG. 23 shows a comparison of the field value at different coil positions.

The X-axis of the coordinate system of FIG. 23 shows distances of the coil 6, 7 relative to the current transferring conductor 3. The Y-axis represents the magnetic flux density (B) of the magnetic field 10 in tesla.

In the example of FIG. 23 support elements 1, 2 are spaced 5 mm from the surface of the current transferring conductor 3.

The sensing coils 6, 7 are spaced about 1.45 mm from the current transferring conductor 3.

The coordinate system shows the total of the magnetic flux density (B) for different lines inside each sensing coil 6, 7.

The various lines inside the sensing coil 6, 7 represent different distances (1 mm to 10 mm) between the current transferring conductor 3 and the sensing coil 6, 7.

The X-axis of the coordinate system represents distances ranging from 0 mm to 6 mm.

Whereas the Y-axis shows magnetic flux density values (B) in tesla, representing different lines inside the coils 6, 7.

By way of example in FIG. 23 one coil 6, 7 is spaced 1.45 mm from the current transferring conductor 3 whereas one support element 1, 2 is spaced 5 mm from the current transferring conductor 3.

Figure 24:
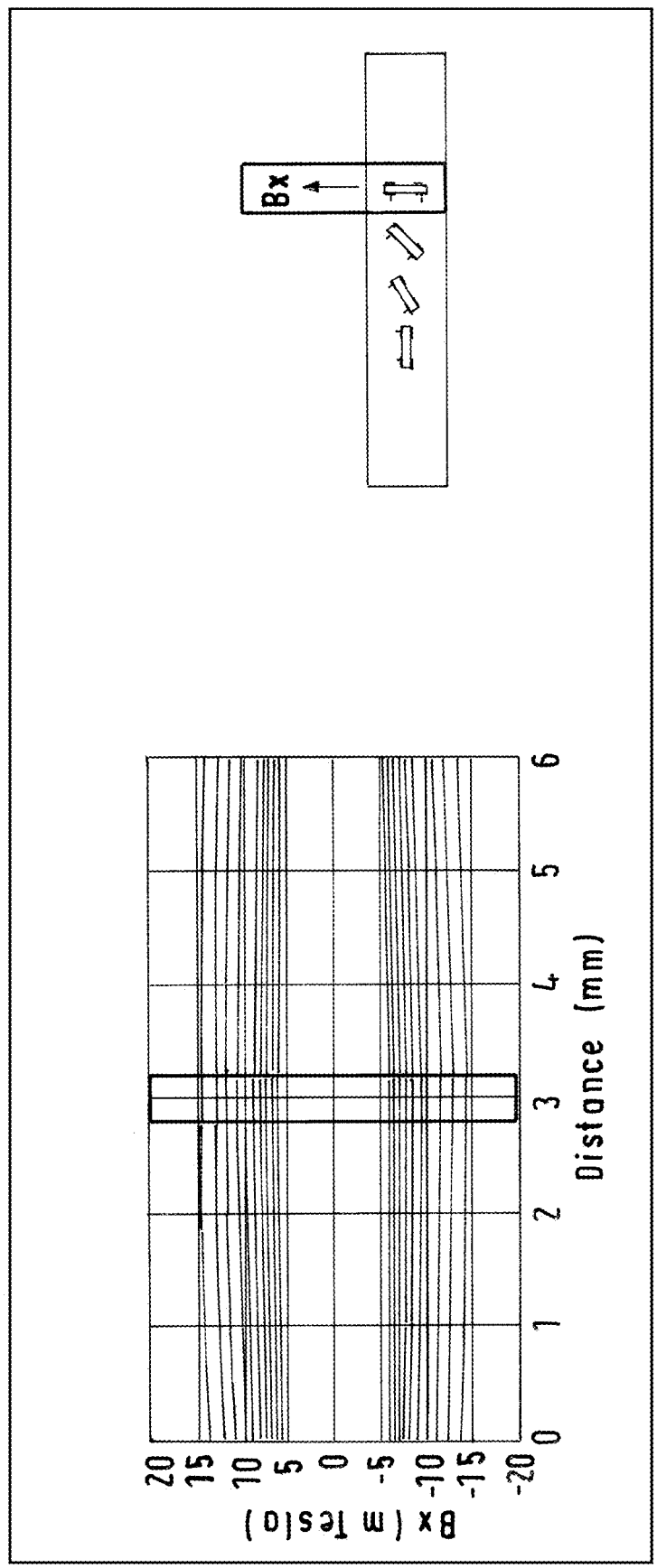
FIG. 24 shows a coordinate system comparable to FIG. 23 referring to the sensing coil having a transverse orientation relative to the longitudinal axis of the common transferring conductor.

FIG. 24 shows a coordinate system comparable to FIG. 23.

In FIG. 24 the sensing coil 6, 7 has a transverse orientation relative to the longitudinal axis 9 of the common transferring conductor 3.

In its transverse orientation relative to the longitudinal axis 9 of the common transferring conductor 3, the coil 6, 7 is positioned in an 90° angle relative to the longitudinal axis 9 of the current transferring conductor 3.

Figure 25:
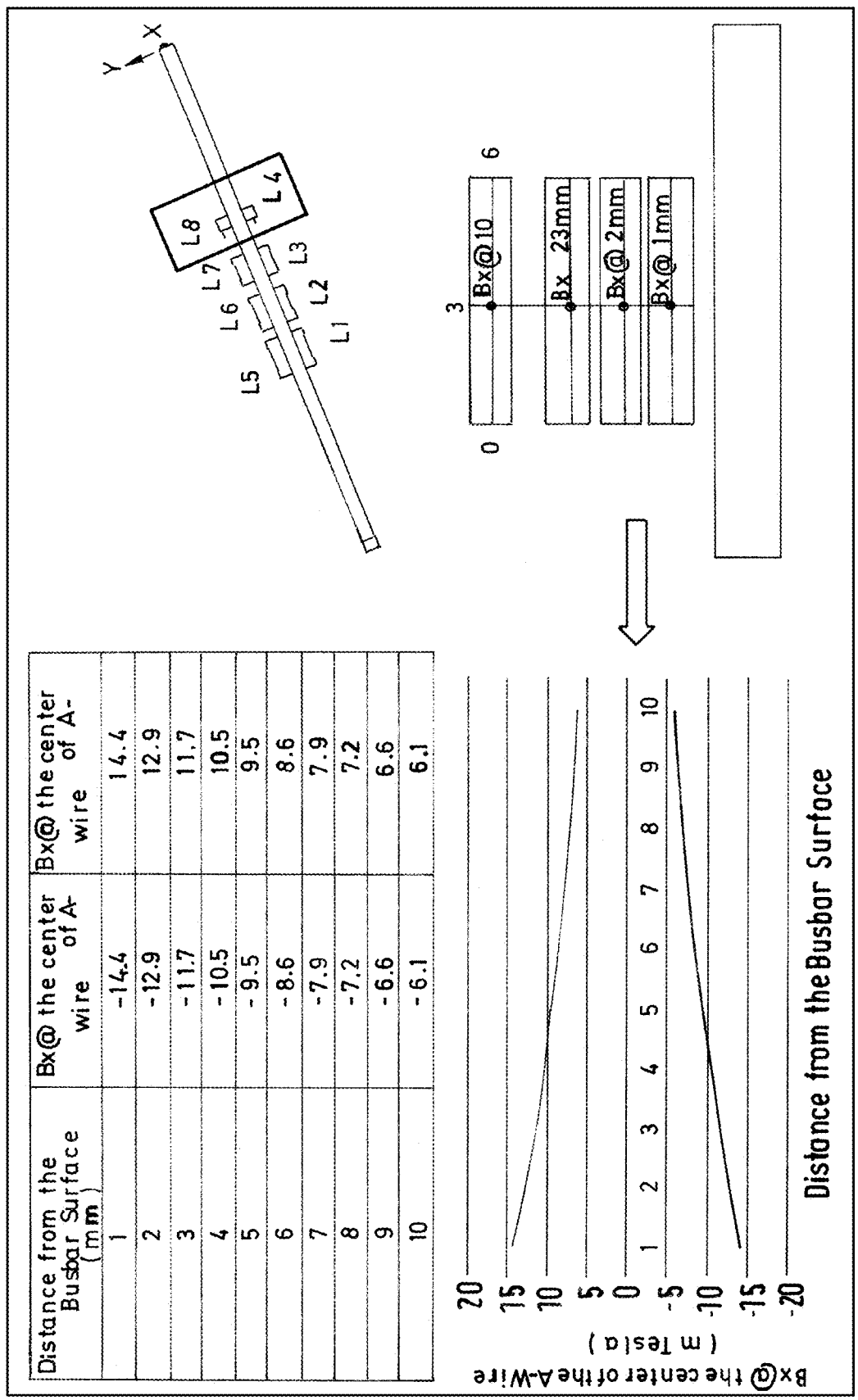
FIG. 25 refers to two individual sensing coils being arranged at different distances relative to the current transferring conductor.

FIG. 25 refers to two individual sensing coils L8 and L4.

Being arranged on the upper side and on the lower side of the current transferring conductor 3, coils L4 and L8 have an opposite orientation relative to the lines of the magnetic field.

Also, the sensing coils L8 and L4 are arranged at different distances relative to the current transferring conductor 3, with the distances ranging from 1 mm to 10 mm.

Depending on the distance of the sensing coil L8 and L4 relative to the current transferring conductor 3 and depending on the orientation of the individual coil L8 and L4 relative to the lines of the magnetic field, the density of the magnetic field 10 relative to the centre of an A-wire of the coil ranges from −14.4 to −6.1 and from 6.1 to 14.14, respectively.

Figure 26:
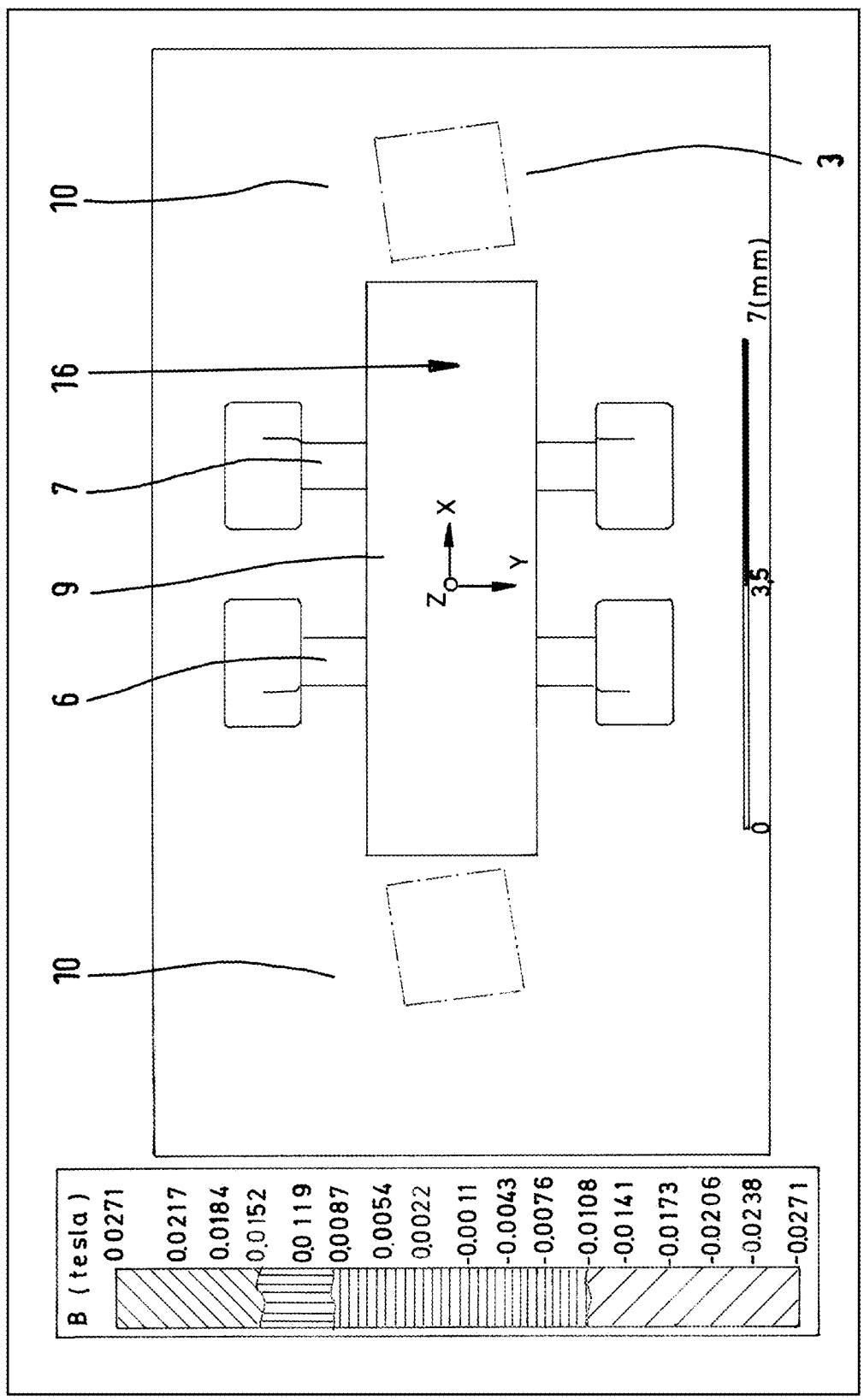
FIG. 26 refers to the FIG. 2 showing the magnetic fields of a current transferring conductor having a bore with two coils extending through the bore.

FIG. 26 shows a current transferring conductor 3 having a bore 16.

Two coils 6 and 7 extend through the bore 16 of the current transferring conductor 3.

The current transferring conductor 3 is cut at right angles to the longitudinal axis 9 of the current transferring conductor 3.

The current flows along the longitudinal axis 9 of the current transferring conductor 3.

Thus, the lines of the magnetic field 10 extend radially relative to the longitudinal axis 9 of the current transferring conductor 3, with the lines of the magnetic field 10 extend through the bore 16 of the current transferring conductor 3.

Figure 27:
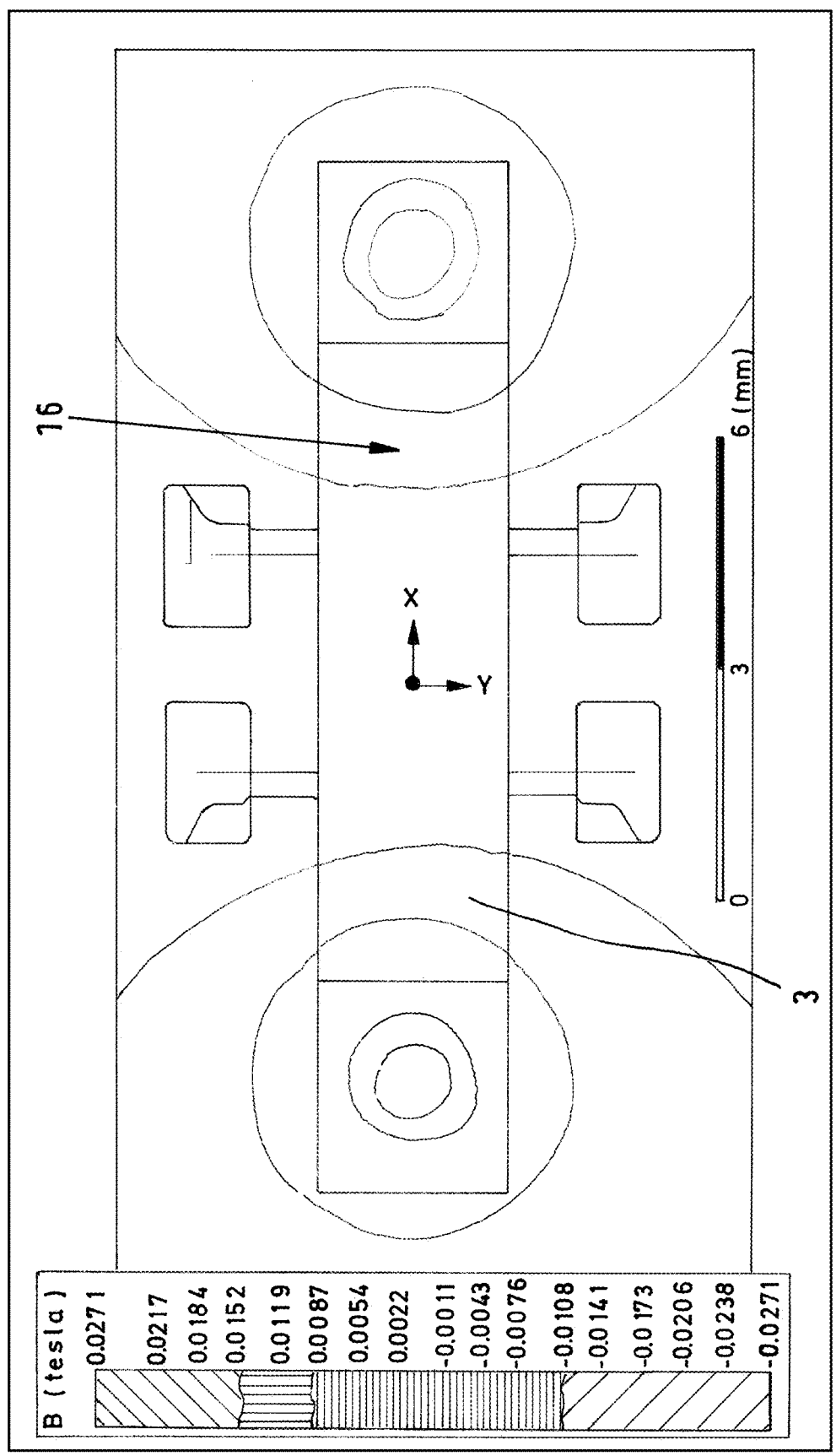
FIG. 27 refers to the FIG. 2 showing the total of the magnetic flux densities both along the arrow X and the arrow Y.

FIG. 27 shows the total of the magnetic flux density both along the arrow X and the arrow Y.

The arrow Y extends through the bore 16 perpendicular to the current transferring conductor 3.

Whereas the arrow x extends in a plane of the current transferring conductor 3.

Figure 28:
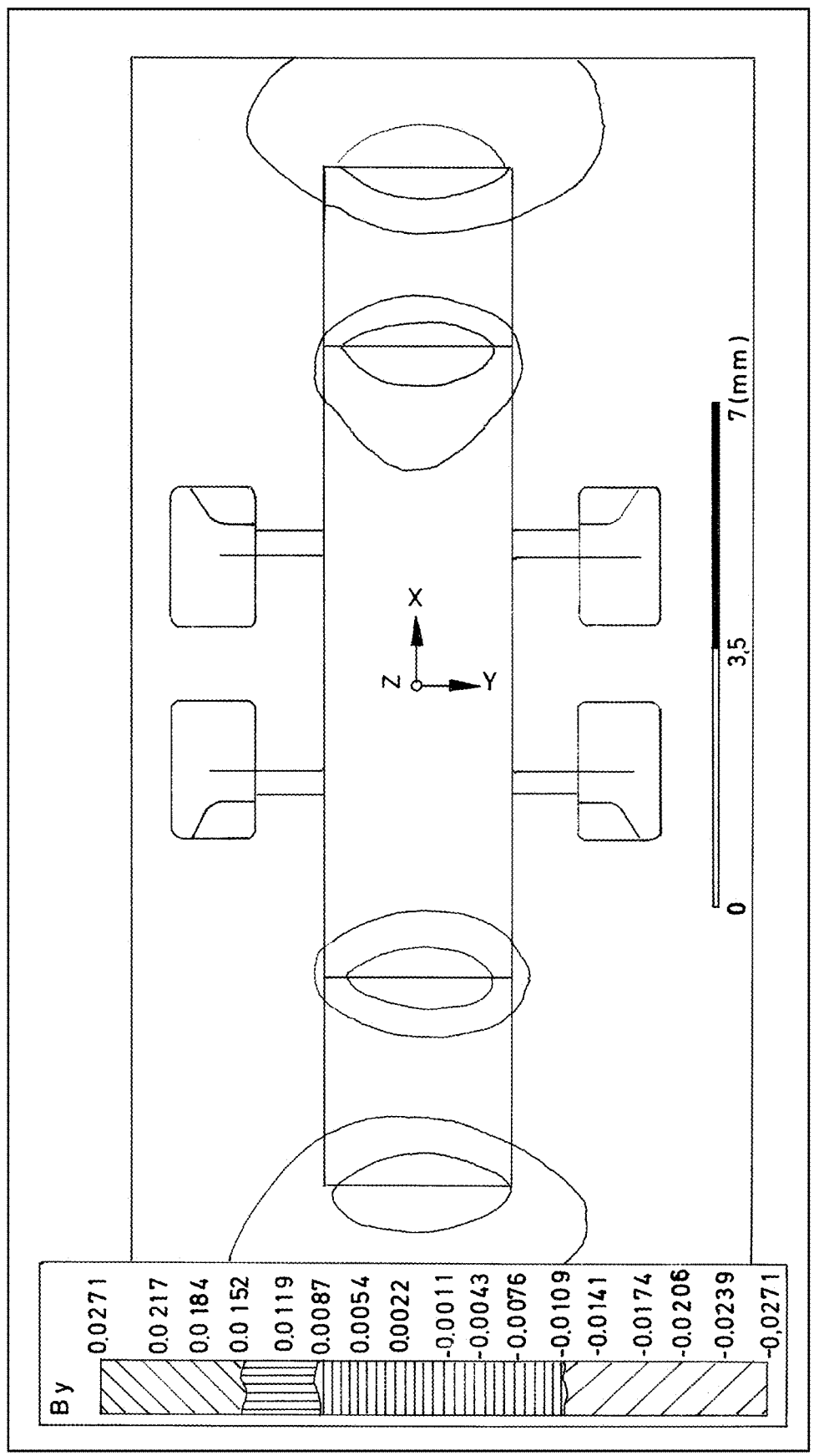
FIG. 28 is similar to the illustration of FIG. 27, differing in that in FIG. 27 the magnetic flux density (B) is shown in the direction of the arrow Y.

The illustration of FIG. 28 is similar to the illustration of FIG. 27.

However, FIG. 28 differs from FIG. 27 in that the magnetic flux density (B) is shown in the direction of the arrow Y extending through the bore 15 of the current transferring conductor 3.

Figure 29:
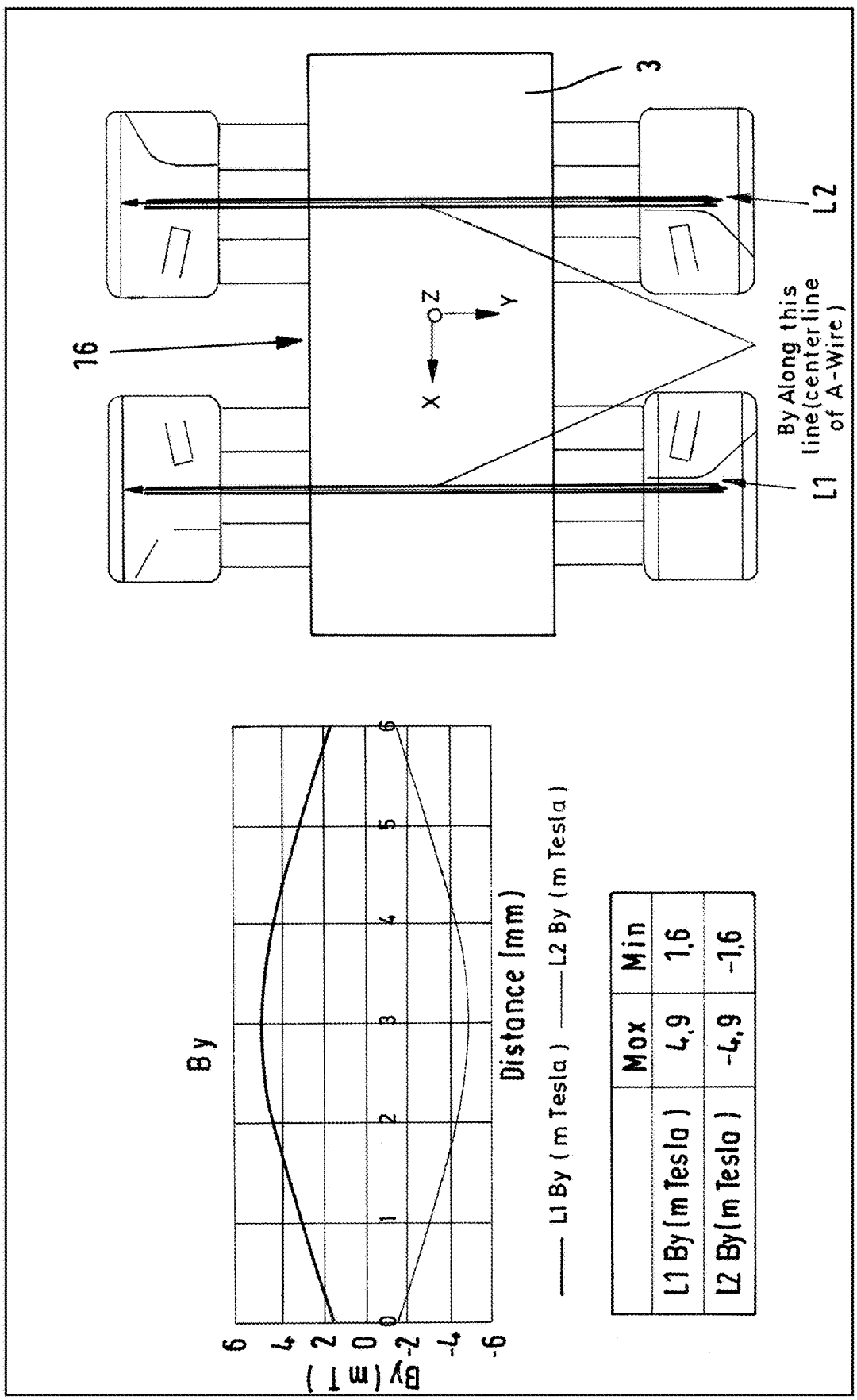
FIG. 29 refers back to the FIG. 2 showing a coordinate system representing the magnetic flux density values depending on the distance of the sensing coil along the arrow Y relative to the current transferring conductor.

FIG. 29 refers to two sensing coils L1 and L2 extending through the bore 16 of the current transferring conductor 3.

Depending on the current flowing through the current transferring conductor 3 each sensing coil L1 and L2 has an individual magnetic field 10.

However, the magnetic lines of the magnetic fields 10 of the sensing coil L1 and L2 are oriented in opposite directions.

Figure 30:
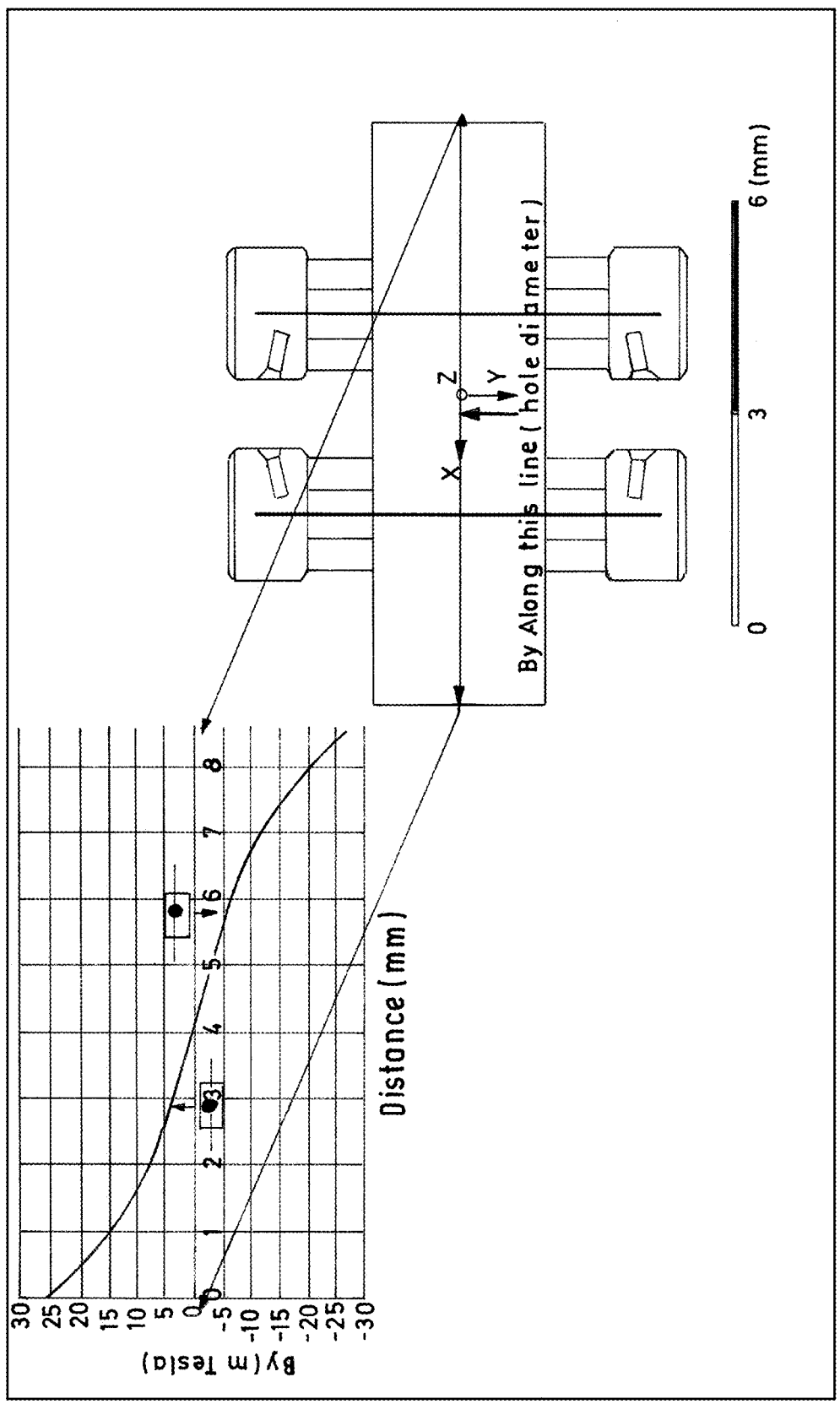
FIG. 30 shows the variation of the magnetic flux density over the diameter of the bore of the current transferring conductor.

FIG. 30 shows the variation of the magnetic flux density over the entire length of the bore 16 of the current transferring conductor 3.

The magnetic flux density of FIG. 30 refers to two sensing coils 6 and 7 extending along the arrow y through the bore 16 of the current transferring conductor 3.

Figure 31:
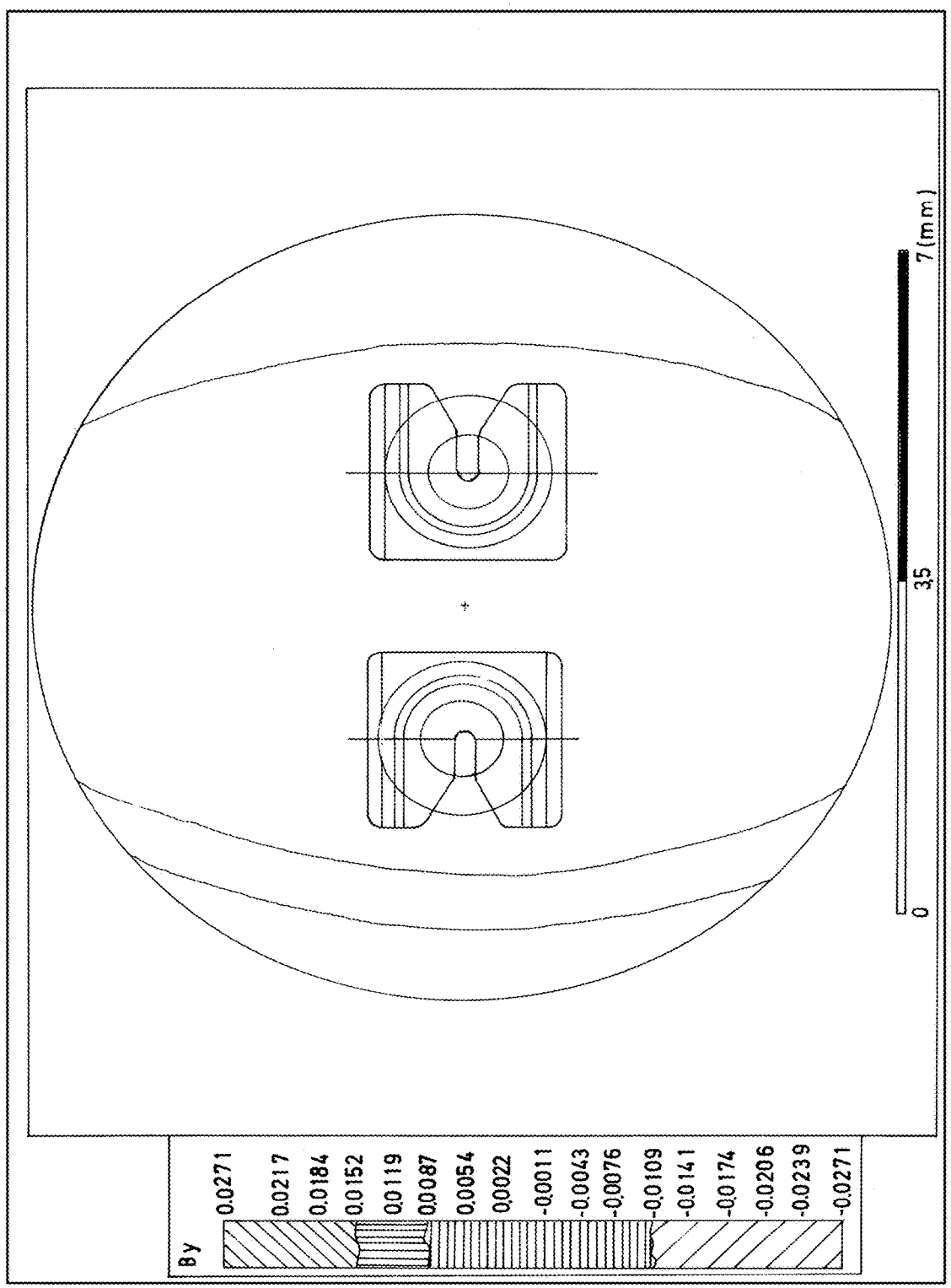
FIG. 31 shows the variation of magnetic field hot spots formed near the bore extending through the current transferring conductor and FIG. 32 shows that the maximum magnetic field at the centre of a flux gate sensor depends on the distance of the flux gate sensor from the current transferring conductor (busbar).

FIG. 31 shows the variation of magnetic field hot spots formed near the bore 16 extending through the current transferring conductor 3.

The magnetic field hot spots are formed near the edges of the

The edges of the bore 16 decrease gradually to the centre of each flux gate sensor.

Thus, the magnetic field hot spot reaches a value of 4.5 m tesla.

Figure 32:
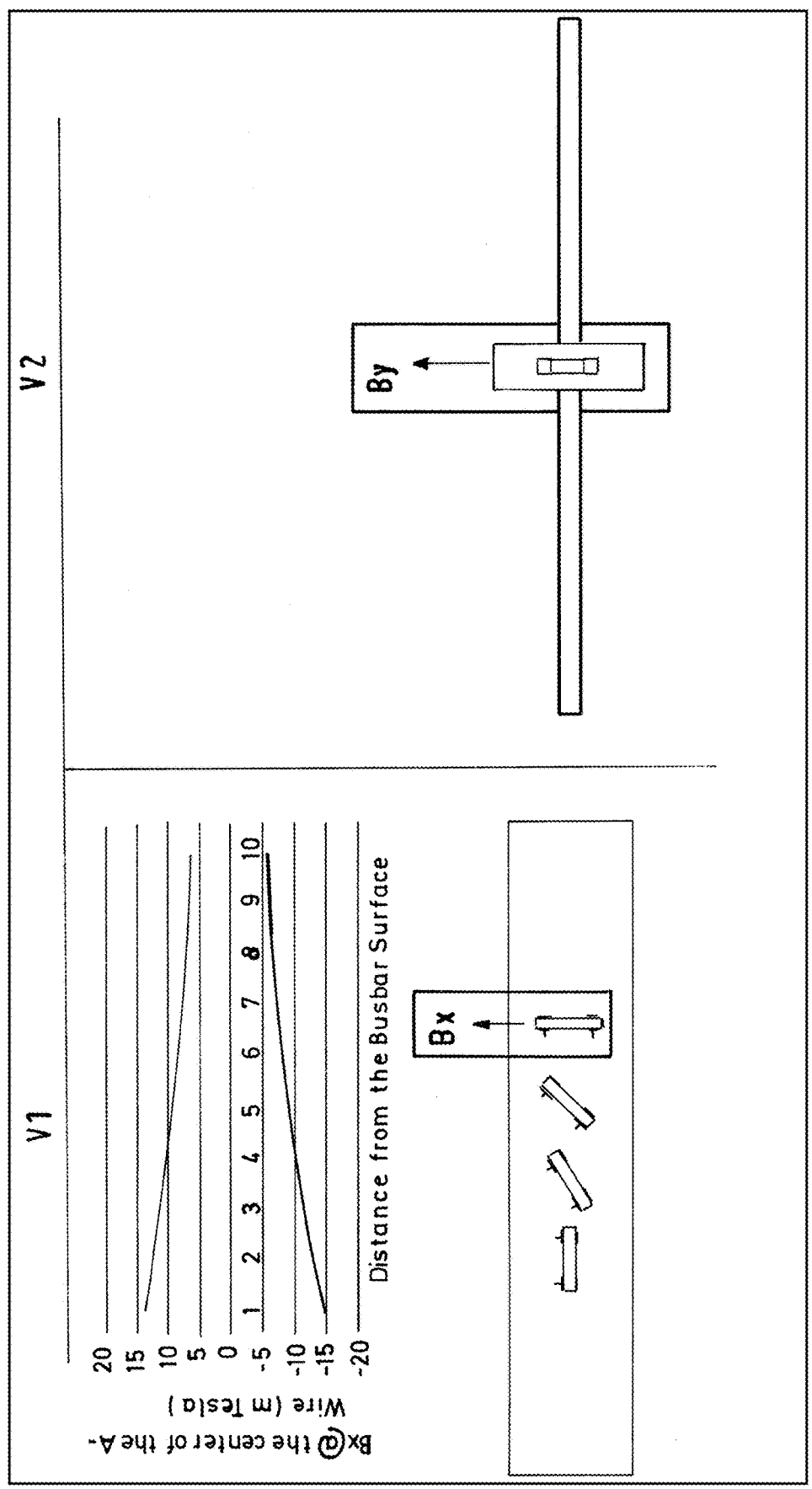

FIG. 32 shows that the maximum magnetic field 10 at the centre of the flux gate depends on the distance of the flux gate from the current transferring conductor 3 (busbar).

In the case of a bore 16 extending through the current transferring conductor 3, the maximum magnetic field at the centre of the flux gate is about 4.9 mT.

Figure 33:
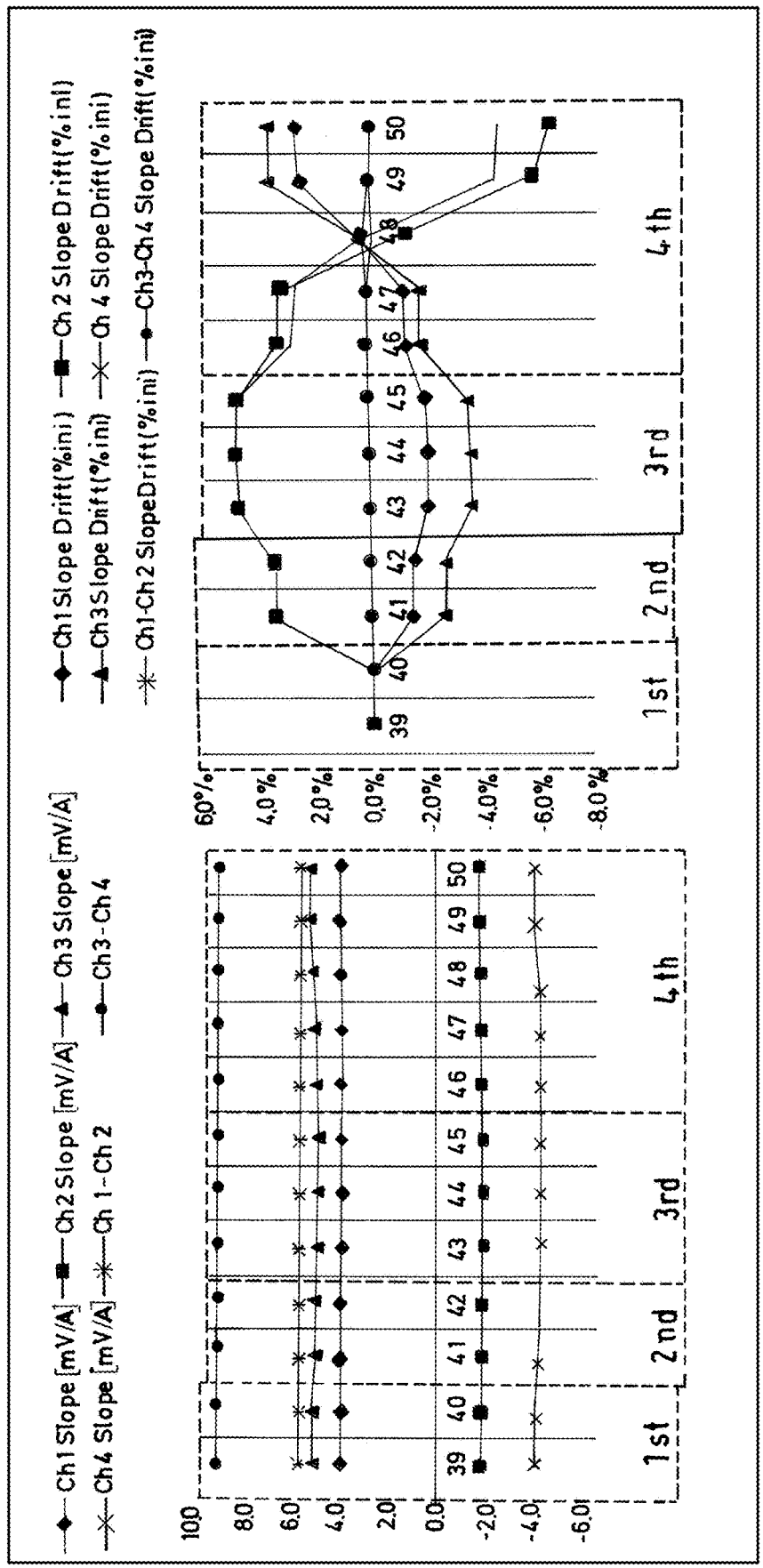
FIG. 33 shows a coordinate system representing four channels. Each channel comprises one sensing coil with the sensing coils having different angles of inclination relative to each other.

FIG. 33 shows a coordinate system representing four channels. Each channel comprises two sensing coils with the sensing coils having the same angles of inclination relative to each other. In the FIG. 33 both the channels and its associated sensing coils are referred to as CH1 to CH4, respectively.

In FIG. 33, the measurement results of the sensing coils (CH1) and (CH2) and the measurement results of the sensing coils (CH3) and (CH4) are subtracted from each other, respectively.

LIST OF REFERENCE

1 Support element
2 Support element
3 Current transferring conductor
4 Face of the support element
5 Face of the support element
6 Sensing coil
7 Sensing coil
8 Current
9 Longitudinal axis
10 Magnetic field
11 Vicinity of the current transferring conductor
12 Angular orientation
13 Angular orientation
14 Angular orientation
15 Angular orientation
16 Bore
17 Polarity of the sensing coil
18 Opposing face
19 Opposing face
20 Horizontal distance

The invention claimed is:

1. A current sensor comprising:
    a plurality of sensing coils;
    at least one support element comprising:
        a first face, and
        a second face,
            wherein the second face is located opposite the first face relative the at least one support element,
            wherein each of the first face and the second face carries at least two sensing coils,
    a current transferring conductor adapted and configured for use with the at least one support element, the current transferring conductor extending along a longitudinal direction;
    wherein, on each of the first face and the second face of the at least one support element, the at least two sensing coils differ from each other in respect to at least one of:
        (i) an angular orientation of an individual sensing coil relative to a longitudinal axis of the current transferring conductor; and (ii) a vertical distance or position of the individual sensing coil relative to a respective side of the current transferring conductor;
    wherein the at least one support element is clipped onto the current transferring conductor and each of the at least two sensing coils are arranged on a respective one of the first face and the second face of the at least one support element adjacent the current transferring conductor; and
    wherein each individual sensing coil is spaced a respective distance from a surface of the current transferring conductor.

2. The current sensor according to claim 1, wherein the current transferring conductor is a busbar.

3. The current sensor according to claim 1, wherein one of the at least two sensing coils is connected with at least one of the at least one support element, with the other of the at least two sensing coils, or with the current transferring conductor in a common mode rejection.

4. The current sensor according to claim 1, wherein the at least one support element extends through a bore provided in the current transferring conductor.

5. The current sensor according to claim 1, wherein the at least two sensing coils are arranged at respective angles relative to the longitudinal axis of the current transferring conductor, where the respective angles of the at least two sensing coils relative to the longitudinal axis differ from each other.

6. The current sensor according to claim 1, wherein the at least two sensing coils are arranged at respective angles relative to the longitudinal axis of the current transferring conductor, where the respective angles of the at least two sensing coils relative to the longitudinal axis are identical to each other.

7. The current sensor according to claim 1, wherein the first face and the second face of the at least one support element are directed towards the current transferring conductor.

8. The current sensor according to claim 1, wherein the first face and the second face of the at least one support element are facing away from the current transferring conductor.

9. The current sensor according to claim 1, wherein the at least two sensing coils are arranged on opposite faces of the at least one support element, where the opposite faces of the at least one support element face away from each other.

10. The current sensor according to claim 1, wherein the at least two sensing coils are arranged symmetrically on respective faces of the at least one support element.

11. The current sensor according to claim 1, wherein the at least two sensing coils are arranged in a direction of the longitudinal axis of the current transferring conductor.

12. The current sensor according to claim 1, wherein the at least two sensing coils are arranged transverse to the longitudinal axis of the current transferring conductor.

13. The current sensor according to claim 1, wherein the at least one support element carries the at least two sensing coils and is connected to the current transferring conductor.

14. The current sensor according to claim 1, wherein, on the first face of the at least one support element, each of the at least two sensing coils is arranged on either side of the current transferring conductor, and wherein, on the second face of the at least one support element, the at least two sensing coils are arranged on one side of the current transferring conductor.

* * * * *